(12) United States Patent
Kami et al.

(10) Patent No.: US 6,663,295 B2
(45) Date of Patent: Dec. 16, 2003

(54) OPTICAL TRANSMITTER-RECEIVER MODULE SUITABLE FOR REDUCING CROSSTALK

(75) Inventors: Nobuharu Kami, Tokyo (JP); Kazuhiko Kurata, Tokyo (JP); Mikio Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 110 days.

(21) Appl. No.: 10/055,931

(22) Filed: Jan. 28, 2002

(65) Prior Publication Data

US 2003/0091303 A1 May 15, 2003

(30) Foreign Application Priority Data

Jan. 26, 2001 (JP) ........................................ 2001-017751

(51) Int. Cl.[7] ................................................. G02B 6/36
(52) U.S. Cl. .............................. 385/92; 385/14; 257/82
(58) Field of Search .............................. 385/14, 88, 89, 385/92, 93; 257/80, 81, 82, 83

(56) References Cited

U.S. PATENT DOCUMENTS

| | | | | | |
|---|---|---|---|---|---|
| 5,499,311 A | * | 3/1996 | DeCusatis | ..................... | 385/89 |
| 5,611,008 A | * | 3/1997 | Yap | ............................. | 385/14 |
| 5,641,612 A | * | 6/1997 | Lee et al. | ..................... | 385/39 |
| 5,780,875 A | * | 7/1998 | Tsuji et al. | .................. | 257/81 |
| 5,854,867 A | * | 12/1998 | Lee et al. | ..................... | 385/93 |
| 5,960,135 A | * | 9/1999 | Ozawa | ........................ | 385/14 |
| 5,981,975 A | * | 11/1999 | Imhoff | ......................... | 257/81 |
| 5,994,154 A | * | 11/1999 | Morikawa | .................... | 257/85 |
| 6,001,664 A | * | 12/1999 | Swirhun et al. | .............. | 257/84 |
| 6,117,794 A | * | 9/2000 | Dormer et al. | ............. | 438/745 |
| 6,144,082 A | * | 11/2000 | Yamazaki et al. | .......... | 257/412 |
| 6,256,437 B1 | * | 7/2001 | Sakushima et al. | ......... | 385/493 |
| 6,344,664 B1 | * | 2/2002 | Trezza et al. | .................. | 257/82 |
| 6,480,639 B2 | * | 11/2002 | Hashimoto et al. | ........... | 385/14 |
| 2002/0001427 A1 | * | 1/2002 | Hashimoto et al. | ........... | 385/14 |

FOREIGN PATENT DOCUMENTS

JP          8116086          5/1996

OTHER PUBLICATIONS

Mori et al.. "MT–RJ Optical Transceiver Module in a Plastic Package for SM Fibers," p. 320.
Ishii et al., MT–RJ Optical Sub Assembly; Crosstalk Analysis of MT–RJ Optical Sub Assembly, p. 352.

\* cited by examiner

Primary Examiner—Frank G. Font
Assistant Examiner—Juan D Valentin, II
(74) Attorney, Agent, or Firm—Young & Thompson

(57) ABSTRACT

An optical transmitter-receiver module includes: an electrically conductive platform substrate having a transmitter region and a receiver region; a first insulating film extending over the transmitter region and the receiver region of the electrically conductive platform substrate; a first electrically conductive layer having a first fixed-potential, and the first electrically conductive layer extending over the first insulating film; a second insulating film selectively extending over the first electrically conductive layer; an optical receiver circuit including a light-receiving device and existing over the second insulating film; an optical transmitter circuit including a light-emitting device existing on the first insulating film; and a first electrically conductive shielding member spatially isolating the optical receiver circuit from the optical transmitter circuit, and being electrically coupled to the first electrically conductive layer.

51 Claims, 28 Drawing Sheets

OPTICAL TRANSMITTER-RECEIVER MODULE SUITABLE FOR REDUCING CROSSTALK

BACKGROUND OF THE INVENTION

1. Field of the Invention

The present invention relates to an optical transmitter-receiver module used in an optimal communication system, and more particularly to an optical transmitter-receiver module which has an integration of a transmitter circuit and a receiver circuit with a reduced crosstalk between the transmitter circuit and the receiver circuit.

2. Description of the Related Art

The optical transmitter-receiver module is suitably applicable to various data communication systems, typically, local area networks and wide area networks. The optical transmitter-receiver module has requirements for further improvement in high speed performance, further cost reduction, and further side reduction or shrinkage. For satisfying those requirements, it is essential that an optical transmitter-receiver device is packaged in compact over a single substrate, wherein the optical transmitter-receiver device has an integration of the optical transmitter circuit and the optical receiver circuit. The optical transmitter circuit includes light emitting devices, whilst the optical receiver circuit includes light receiving devices. In general, a minimum output current from the light receiving device is much smaller than a driving current for driving the light emitting device. For example, the driving current for driving the light emitting device is 100 mA, whilst the minimum output current from the light receiving device is 10 micro-A, so that a difference is 80 dB.

The optical transmitter-receiver device often uses a standard connector MT-RJ. In this case, a distance between the light emitting device and the light receiving device should be narrow, for example, 750 micrometers. If the optical transmitter-receiver device is required to perform a high bit rate, for example, 10 Gbps or higher, then an undesirable crosstalk between the transmitter circuit and the receiver circuit becomes remarkable.

In order to reduce the crosstalk between the transmitter circuit and the receiver circuit, it is effective to provide a shielding plate between the transmitter circuit and the receiver circuit. This idea is disclosed in 2000 Electronics Information Communication Society SC-3-7, entitled "Analysis of Crosstalk for MT-RJ Optical Sub-Assembly".

FIG. 1 is a schematic perspective view illustrative of a conventional optical transmitter-receiver module having an integration of the optical transmitter circuit and the optical receiver circuit over a single platform substrate. The conventional optical transmitter-receiver module has a silicon platform substrate 101. A silicon oxide film 102 overlies the silicon platform substrate 101. Interconnections 103 and 106 are selectively provided over the silicon oxide film 102 in an optical transmitter circuit region and an optical receiver circuit region respectively. A light receiving device 104 and a receiver LSI circuit 105 are further provided in the optical receiver circuit region. A light emitting device 107 and a transmitter LSI circuit 108 are further provided in the optical transmitter circuit region. Further, a shielding plate 109 is provided between the optical transmitter circuit region and the optical receiver circuit region. The above-described literature reported that the shielding plate reduces the crosstalk by about 20 dB at 1 GHz.

Both the light emitting device and the light receiving device are optically coupled through a ferrule to optical fibers. FIG. 2 is a plane view illustrative of the optical transmitter-receiver module of FIG. 1. The light receiving device 104 and the light emitting device 107 are optically coupled through a ferrule 114 to optical fibers 118 respectively. The ferrule 114 include short optical fibers 115 which are optically coupled to the light receiving device 104 and the light emitting device 107. The optical fibers 118 are further optically coupled to the short optical fibers 115 of the ferrule 114. The ferrule 114 may be made of a resin material. The ferrule 114 is aligned to the silicon platform substrate 101, so that the short optical fibers 115 which are aligned to the light receiving device 104 and the light emitting device 107 respectively.

The optical fibers 118 are supported by an optical connector 117 which is mechanically coupled with the ferrule 114, wherein the ferrule 114 has plural engaging projections 114a, whilst the optical connector 117 has plural engaging holes 117a which are engagable with the engaging projections 114a of the ferrule 114. This engagement mechanism aligns the optical connector 117 to the ferrule 114, whereby the optical fibers 118 are aligned to the short optical fibers 115.

The ferrule 114 is made of an optical shielding resin material which contains an light-absorbing additive such as a black pigment, in order to prevent that a stray light generated in the transmitter side undesirably enters into the receiver side. The interpose of the ferrule 114 between the optical connector and the transmitter circuit and the receiver circuit is disclosed in 2000 Electronics Information Communication Society S-3-140, entitled "SM-Fiber MT-RJ Optical Transceiver Module".

For integrally packaging the light emitting device and the light receiving device over a single substrate, silicon may often be selected for the substrate material because of its low cost and high beat conductivity. Silicon has a high heat conductivity of 150 W/mk whilst alumina has a high heat conductivity of 20 W/mk. Since silicon is relatively high in electrical conductivity as compared to insulators, as shown in FIG. 1, the light emitting device and the light receiving device are electrically coupled through the silicon platform substrate 101 but weakly, however, a relatively large cross talk appears through the silicon platform substrate 101 between the transmitter circuit and the receiver circuit.

Silicon is much lower in electrical conductivity than metal materials. Silicon has a specific resistivity of about 1E4 ohms cm, whilst copper has a specific resistivity of about 1.6E-64 ohms cm. Even if the silicon platform substrate 101 is grounded, the electrical coupling is still present between the transmitter circuit and the receiver circuit through the silicon platform substrate 101. It was confirmed that it is difficult to reduce the crosstalk to about −80 dB at 10 GHz.

It was proposed that in order to reduce the crosstalk, the silicon substrate is divided into the transmitter side and the receiver side for preventing the electrical coupling between the transmitter circuit and the receiver circuit through the silicon substrate. Separate packaging processes of the light emitting device and the light receiving device over the divided silicon substrate and separate alignment processes in optical axis are necessary. This increases the fabrication processes and also the final product cost.

As described above, the ferrule 114 is made of the optical shielding resin material which shields the stray light but does not shield electromagnetic waves. The resin ferrule 114 undesirably allows formation of an electromagnetic wave propagation route 116 at a confronting edge of the silicon platform substrate 101 to the ferrule 114. This electromagnetic wave propagation route 116 allows propagation of electromagnetic wave from the transmitter side to the receiver side, resulting in a possible generation of the undesirable crosstalk between the transmitter circuit and the receiver circuit.

If the ferrule 114 is made of a metal which is capable of shielding the electromagnetic wave for suppressing any formation of the electromagnetic wave propagation route 116, then the following difficulty is alternatively raised. As described above, the ferrule 114 has holes for incorporating the short optical fibers 115, wherein the holes have a diameter which is slightly larger than a diameter of the short optical fibers 115, and further the holes are distanced at a pitch exactly identical with a pitch between the light emitting device and the light receiving device. This means it necessary that the holes are formed in the metal ferrule 114 at extremely high accuracy. The processings to the metal ferrule 114 at such extremely high accuracy is difficult, resulting in reduction of productivity.

In the above circumstances, the development of a novel free from the above problems is desirable.

SUMMARY OF THE INVENTION

Accordingly, it is an object of the present invention to provide a novel optical transmitter-receiver module free from the above problems.

It is a further object of the present invention to provide a novel optical transmitter-receiver module using a single electrically conductive platform substrate, which suppresses any formation of electrical crosstalk routes.

It is a still further object of the present invention to provide a novel optical transmitter-receiver module using a single electrically conductive platform substrate, which suppresses any formation of electromagnetic wave crosstalk routes and optical crosstalk route on a confronting side of the platform substrate.

The present invention provides an optical transmitter-receiver module comprising: an electrically conductive platform substrate having a transmitter region and a receiver region; a first insulating film extending over the transmitter region and the receiver region of the electrically conductive platform substrate; a first electrically conductive layer having a first fixed-potential, and the first electrically conductive layer extending in the receiver region and over the first insulating film; a second insulating film selectively extending over the first electrically conductive layer; an optical receiver circuit including at least a light-receiving device, and the optical receiver circuit existing over the second insulating film; an optical transmitter circuit including at least a light-emitting device, the optical transmitter circuit existing in the transmitter region, and the light-emitting device existing on the first insulating film; and a first electrically conductive shielding member spatially isolating the optical receiver circuit from the optical transmitter circuit, and the first electrically conductive shielding member being electrically coupled to the first electrically conductive layer, so that the first electrically conductive shielding member has the first fixed-potential.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
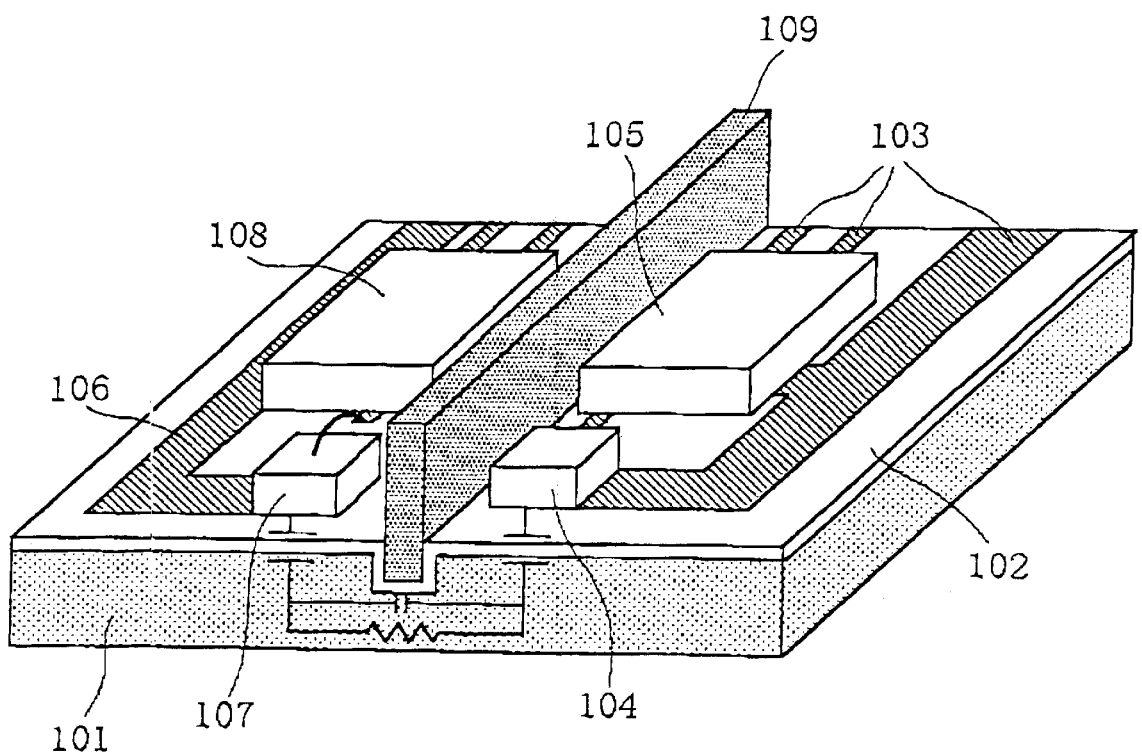
FIG. 1 is a schematic perspective view illustrative of a conventional optical transmitter-receiver module.
Figure 2:
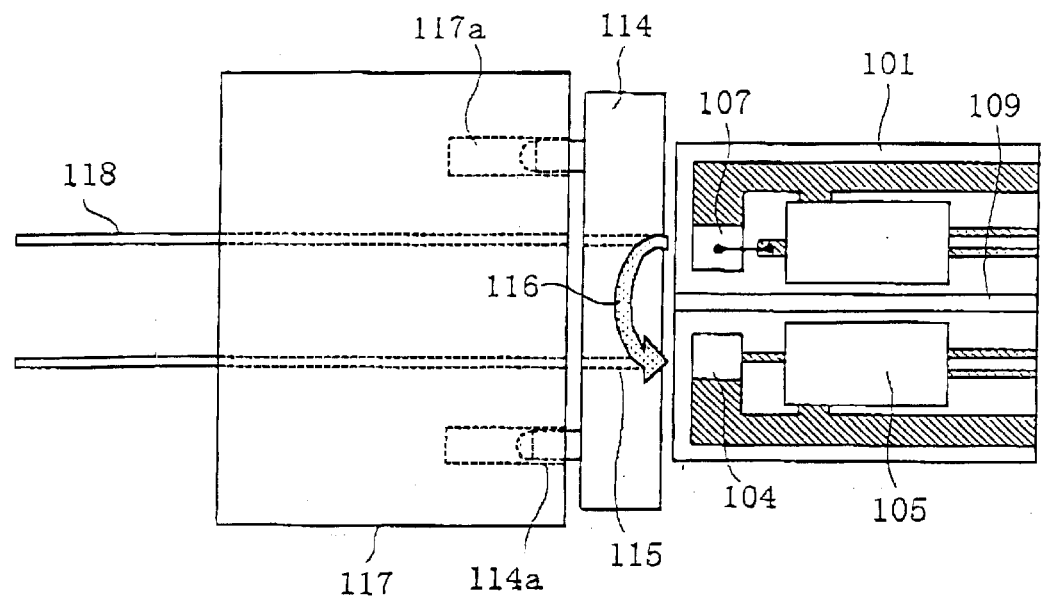
FIG. 2 is a plane view illustrative of the optical transmitter-receiver module of FIG. 1.

A first aspect of the present invention is an optical transmitter-receiver module comprising: an electrically conductive platform substrate having a transmitter region and a receiver region; a first insulating film extending over the transmitter region and the receiver region of the electrically conductive platform substrate; a first electrically conductive layer having a first fixed-potential, and the first electrically conductive layer extending in the receiver region and over the first insulating film; a second insulating film selectively extending over the first electrically conductive layer; an optical receiver circuit including at least a light-receiving device, and the optical receiver circuit existing over the second insulating film; an optical transmitter circuit including at least a light-emitting device, the optical transmitter circuit existing in the transmitter region and the light-emitting device existing on the first insulating film; and a first electrically conductive shielding member spatially isolating the optical receiver circuit from the optical transmitter circuit, and the first electrically conductive shielding member being electrically coupled to the first electrically conductive layer, so that the first electrically conductive shielding member has the first fixed-potential.

It is also possible that the light-emitting device exists directly on a first interconnection pattern on the first insulating film.

It is also possible that the first insulating film has a smaller thickness than the second insulating film. It is also possible that the first insulating film comprises an oxide film, and the second insulating film comprises an electrically insulative resin film. It is also possible that the optical receiver circuit exists directly on a first conductive pattern extending over the second insulating film.

It is also possible to further comprise: a third insulating film selectively extending in the transmitter region and over the first insulating film, except over the light-emitting device; and a second conductive pattern extending over the third insulating film, and wherein the optical transmitter circuit further includes at least a first integrated circuit existing directly on the second conductive pattern, and the first integrated circuit is electrically connected through a wiring to the light-emitting device. It is also possible that the first insulating film has a smaller thickness than the third insulating film. It is also possible that the third insulating film comprises an electrically insulative resin film.

It is also possible that the electrically conductive shielding member spatially surrounds the second insulating film and the optical receiver circuit. It is also possible that the electrically conductive shielding member has a bottom directly on a peripheral region of the first electrically conductive layer, so that the electrically conductive shielding member is electrically coupled with the first electrically conductive layer.

It is also possible to further comprise a second electrically conductive layer having a second fixed potential, and the second electrically conductive layer extending in the transmitter region and over the first insulating film, and the light-emitting device exists directly on the second electrically conductive layer.

It is also possible to further comprise: a third insulating film selectively extending in the transmitter region and over the second electrically conductive layer, except over the light-emitting device; and a second conductive pattern extending over the third insulating film, and wherein the optical transmitter circuit further includes at least a first integrated circuit existing directly on the second conductive pattern, and the first integrated circuit is electrically connected through a wiring to the light-emitting device. It is also possible that the first insulating film has a smaller thickness than the third insulating film. It is also possible that the third insulating film comprises an electrically insulative resin film.

It is also possible to further comprise: an optical transmission guide having a sloped light-reflecting terminal face which is positioned under a light-receiving area on a bottom surface of the light-receiving device.

It is also possible that the optical transmission guide comprises a groove with the sloped light-reflecting terminal face, and the groove exists in the electrically conductive platform, the first insulating film, the first electrically conductive layer, and the second insulating film.

It is also possible to further comprise: a second electrically conductive shielding member which exists adjacent to a first side face of the electrically conductive platform substrate, and the second electrically conductive shielding member which faces to the light-receiving device and the light-emitting device, and the second electrically conductive shielding member having a first light transmission hole for allowing a transmission of a light to be incident into the light-receiving device, and a second light transmission hole for allowing a transmission of a light emitted from the light-emitting device.

It is also possible that the second electrically conductive shielding member is electrically coupled to the first electrically conductive shielding member, so that the second electrically conductive shielding member also has the first fixed-potential.

It is also possible that the second electrically conductive shielding member is mechanically in contact directly with the first electrically conductive shielding member.

It is also possible that the second electrically conductive shielding member is mechanically connected with the first electrically conductive shielding member.

It is also possible that the second electrically conductive shielding member has a first face which faces to the first side face of the electrically conductive platform substrate, and a second face opposite to the first face, and the second face holds an optical lens array which includes a first lens aligned to the first light transmission hole, and a second lens aligned to the second light transmission hole. It is also possible that the second face has a recess which engages the optical lens array. It is also possible that the second electrically conductive shielding member comprises a metal plate.

It is also possible that the electrically conductive platform substrate has a bottom surface which includes a depressed region being positioned under the light-emitting device, so that the electrically conductive platform substrate has a thickness-reduced portion under the light-emitting device. It is also possible to further comprise: a first electrically conductive bottom layer on the bottom surface of the electrically conductive platform substrate.

It is also possible to further comprise: a first electrically insulative bottom layer on the bottom surface of the electrically conductive platform substrate; and a first electrically conductive bottom layer on the first electrically insulative bottom layer.

A second aspect of the present invention is an optical transmitter-receiver module comprising: an electrically conductive platform substrate having a transmitter region and a receiver region; a first insulating film extending over the transmitter region and the receiver region of the electrically conductive platform substrate; a first electrically conductive layer having a first fixed-potential, and the first electrically conductive layer extending in the receiver region and over the first insulating film; a second insulating film selectively extending over the first electrically conductive layer; an optical receiver circuit including at least a light-receiving device, and the optical receiver circuit existing over the second insulating film an optical transmitter circuit including at least a light-emitting device, the optical transmitter circuit existing in the transmitter region, and the light-emitting device existing on the first insulating film; a first electrically conductive shielding member spatially isolating the optical receiver circuit from the optical transmitter circuit, and the first electrically conductive shielding member being electrically coupled to the first electrically conductive layer, so that the first electrically conductive shielding member has the first fixed-potential; and a second electrically conductive shielding member which exists adjacent to a first side face of the electrically conductive platform substrate, and the second electrically conductive shielding member which faces to the light-receiving device and the light-emitting device, and the second electrically conductive shielding member having a first light transmission hole for allowing a transmission of a light to be incident into the light-receiving device, and a second light transmission hole for allowing a transmission of a light emitted from the light-emitting device.

It is also possible that the light-emitting device exists directly on a first interconnection pattern on the first insulating film.

It is also possible that the first insulating film has a smaller thickness than the second insulating film. It is also possible that the first insulating film comprises an oxide film, and the second insulating film comprises an electrically insulative resin film. It is also possible that the optical receiver circuit exists directly on a first conductive pattern extending over the second insulating film.

It is also possible to further comprise: a third insulating film selectively extending in the transmitter region and over the first insulating film, except over the light-emitting device; and a second conductive pattern extending over the third insulating film, and wherein the optical transmitter circuit further includes at least a first integrated circuit existing directly on the second conductive pattern, and the first integrated circuit is electrically connected through a wiring to the light-emitting device.

It is also possible that the first insulating film has a smaller thickness than the third insulating film. It is also possible that the third insulating film comprises an electrically insulative resin film.

It is also possible that the electrically conductive shielding member spatially surrounds the second insulating film and the optical receiver circuit. It is also possible that the electrically conductive shielding member has a bottom directly on a peripheral region of the first electrically conductive layer, so that the electrically conductive shielding member is electrically coupled with the first electrically conductive layer.

It is also possible to further comprise a second electrically conductive layer having a second fixed potential, and the second electrically conductive layer extending in the transmitter region and over the first insulating film, and the light-emitting device exists directly on the second electrically conductive layer.

It is also possible to further comprise: a third insulating film selectively extending in the transmitter region and over the second electrically conductive layer, except over the light-emitting device; and a second conductive pattern extending over the third insulating film, and wherein the optical transmitter circuit further includes at least a first integrated circuit existing directly on the second conductive pattern, and the first integrated circuit is electrically connected through a wiring to the light-emitting device.

It is also possible that the first insulating film has a smaller thickness than the third insulating film. It is also possible that the third insulating film comprises an electrically insulative resin film.

It is also possible to further comprise: an optical transmission guide having a sloped light-reflecting terminal face which is positioned under a light-receiving area on a bottom surface of the light-receiving device. It is also possible that the optical transmission guide comprises a groove with the sloped light-reflecting terminal face, and the groove exists in the electrically conductive platform, the first insulating film, the first electrically conductive layer, and the second insulating film.

It is also possible that the second electrically conductive shielding member is electrically coupled to the first electrically conductive shielding member, so that the second electrically conductive shielding member also has the first fixed-potential. It is also possible that the second electrically conductive shielding member is mechanically in contact directly with the first electrically conductive shielding member.

It is also possible that the second electrically conductive shielding member is mechanically connected with the first electrically conductive shielding member.

It is also possible that the second electrically conductive shielding member has a first face which faces to the first side face of the electrically conductive platform substrate, and a second face opposite to the first face, and the second face holds an optical lens array which includes a first lens aligned to the first light transmission hole, and a second lens aligned to the second light transmission hole. It is also possible that the second face has a recess which engages the optical lens array. It is also possible that the second electrically conductive shielding member comprises a metal plate.

It is also possible that the electrically conductive platform substrate has a bottom surface which includes a depressed region being positioned under the light-emitting device, so that the electrically conductive platform substrate has a thickness-reduced portion under the light-emitting device.

It is also possible to further comprise: a first electrically conductive bottom layer on the bottom surface of the electrically conductive platform substrate. It is also possible to further comprise: a first electrically insulative bottom layer on the bottom surface of the electrically conductive platform substrate and a first electrically conductive bottom layer an the first electrically insulative bottom layer.

Figure 3:
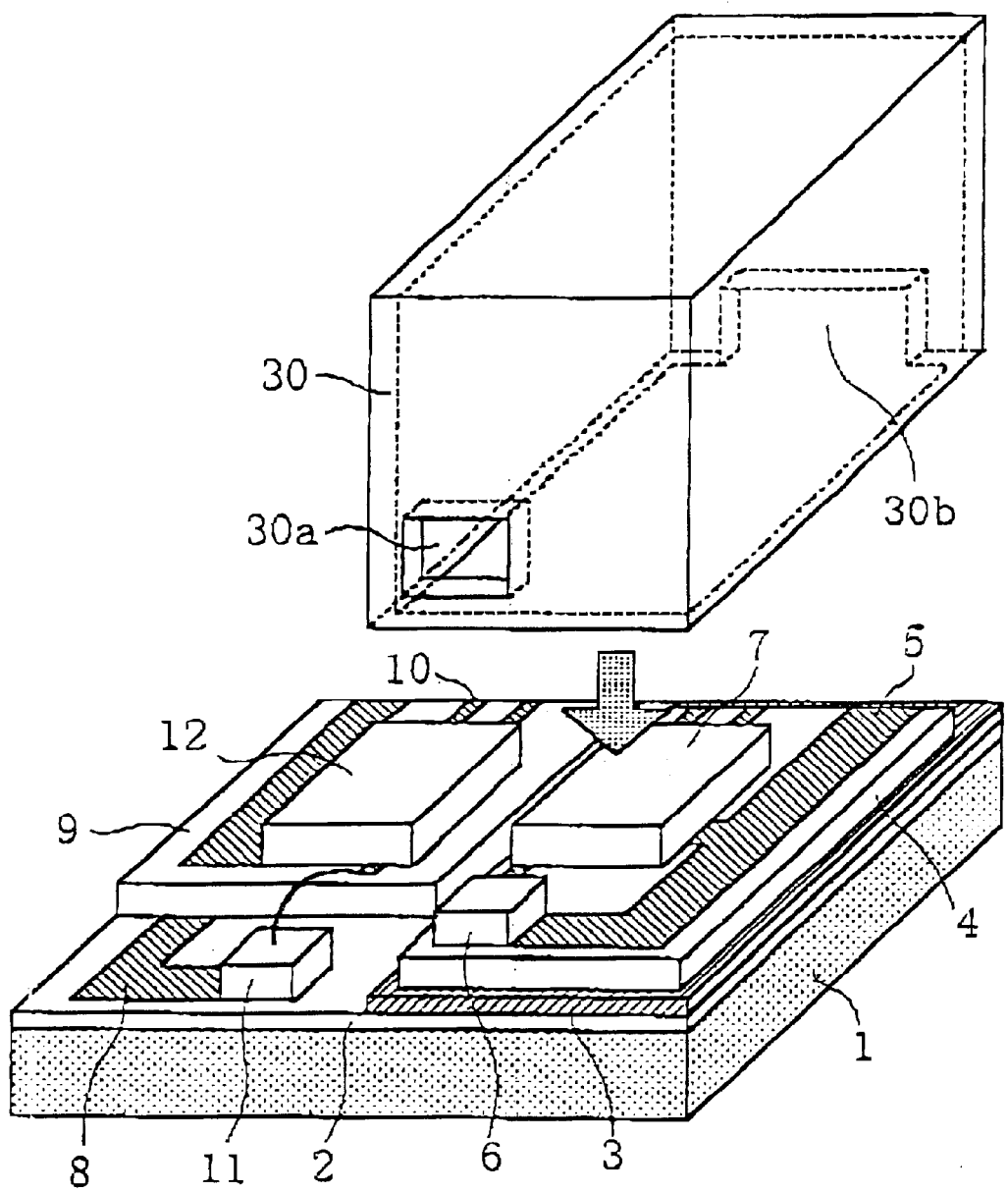
FIG. 3 is a schematic perspective view illustrative of a novel optical transmitter-receiver module in a first embodiment in accordance with the present invention.
Figure 4:
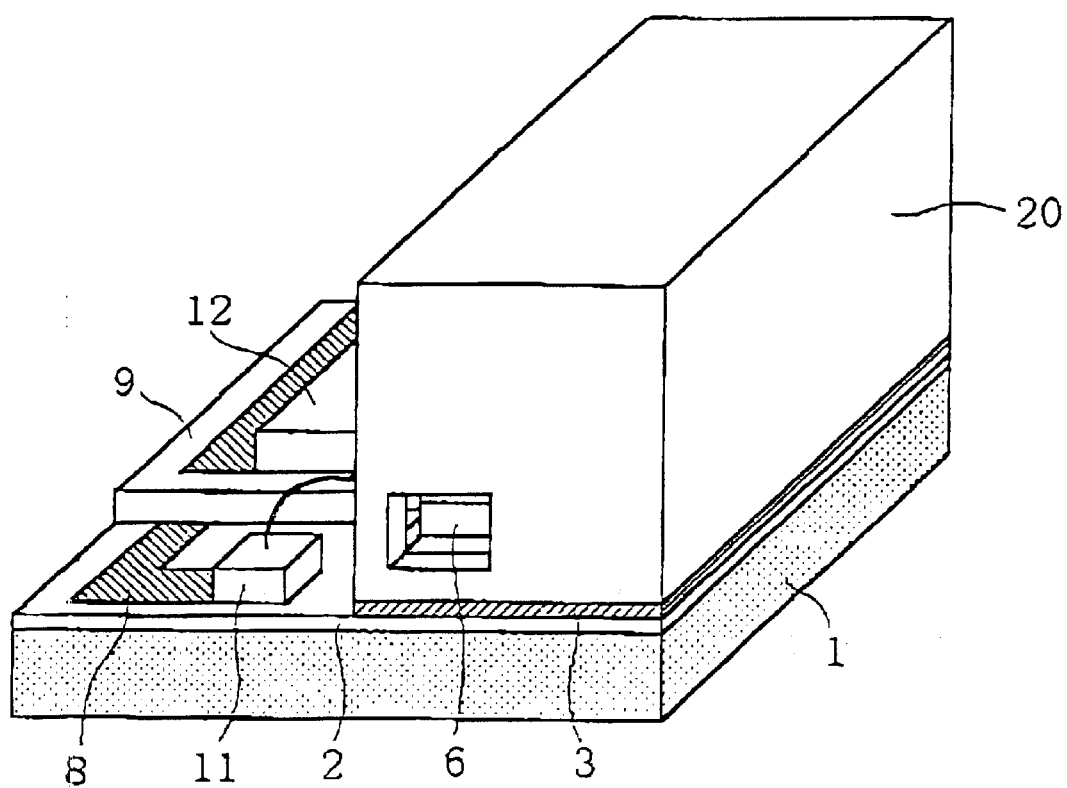
FIG. 4 is a schematic perspective view illustrative of a novel optical transmitter-receiver module of FIG. 3, wherein an electrically conductive shielding cover is provided.

First Embodiment:

A first embodiment according to the present invention will be described in detail with reference to the drawings. FIG. 3 is a schematic perspective view illustrative of a novel optical transmitter-receiver module having an integration of an optical transmitter circuit and an optical receiver circuit over a single platform substrate, wherein the optical receiver circuit has not yet been covered by an electrically conductive shielding cover. FIG. 4 is a schematic perspective view illustrative of a novel optical transmitter-receiver module having an integration of an optical transmitter circuit and an optical receiver circuit over a single platform substrate, wherein the optical receiver circuit has already been covered by an electrically conductive shielding cover for the purpose of suppressing any formation of electrical crosstalk routes as well as suppressing any formation of electromagnetic wave crosstalk routes and optical crosstalk route on a confronting side of the platform substrate.

The novel optical transmitter-receiver module has a silicon platform substrate 1. A silicon oxide film 2 overlies an entirety of an upper surface of the silicon platform substrate 1. A ground conductive pattern 3 is selectively provided which covers almost an entirety of an optical receiver circuit region. An insulating layer 4 is selectively provided over the ground conductive pattern 3 except over a peripheral region of the ground conductive pattern 3. The insulating layer 4 is made of a polyimide resin. Interconnection patterns 5 are selectively provided over the insulating layer 4. The interconnection patterns 5 include a ground layer, a power transmission layer and a signal transmission layer. A light emitting device 6 and a receiver LSI circuit 7 are also selectively provided over the insulating layer 4.

An interconnection pattern 8 is selectively provided over the silicon oxide film 2 and in the optical transmitter circuit region. An insulating layer 9 is selectively provided over the interconnection pattern 8 and the silicon oxide film 2 and in the optical transmitter circuit region. The insulating layer 9 is retracted from a light emitting facet. The insulating layer 9 is made of a polyimide resin. Interconnection patterns 10 are selectively provided over the insulating layer 9. The interconnection patterns 10 include a ground layer, a power transmission layer and a signal transmission layer. A light emitting device 11 is selectively provided over the silicon oxide film 2 and in the optical transmitter circuit region. A transmitter LSI circuit 12 is selectively provided over the insulating layer 9. The light emitting device 11 is electrically connected through wirings to the transmitter LSI circuit 12. Since the light emitting device 11 is different in level from the transmitter LSI circuit 12, the length of the interconnecting wirings may optionally be shortened in order to improve the high frequency performance of the optical transmitter circuit.

An entirety of the optical receiver circuit is covered by an electrically conductive shielding cover 30. The electrically conductive shielding cover 30 has a bottom-opened box. The electrically conductive shielding cover 30 also has a front side face which includes an opening 30a for allowing incidence of light into the light receiving device. The electrically conductive shielding cover 30 also has a rear side face which includes a recess 30b for allowing extension of one or more signal lines from the receiver LSI circuit 7. The opening 30a is preferably as small unless the light incidence is disturbed. The recess 30b is also preferably as small unless electric characteristics such as intrinsic impedance of the signal line are disturbed. The opening 30a is illustrated to be shaped in rectangle but other shape may be optional. The recess 30b is also illustrated to be shaped in rectangle but other shape may be optional. The thickness of the electrically conductive shielding cover 30 is sufficiently large for surely shielding the electromagnetic wave. The electrically conductive shielding cover 30 may optionally be fixed to the ground conductive pattern 3 by using a solder or an electrically conductive paste.

As described above, the light receiving device 6 is provided over the insulating layer 4 in the optical receiver circuit region, whilst the light emitting device 11 is provided directly on the interconnection pattern 8 over the silicon oxide film 2 in the optical transmitter circuit region for the following important reasons. The insulating layer 4 is relatively thick, for example, about 10–40 micrometers because the interconnection pattern 5 over the insulating layer 4 includes a coplanar signal transmission line which has a desirable high frequency performance. If the insulating layer 4 is thin, this makes it difficult to design the coplanar signal transmission line. The insulating layer 4 being thick may desirably be made of a resin material. However, the light emitting device 11 is driven by a large current, for example, about several tends mA to one hundred mA. If, contrary to the present invention, the light emitting device 11 is provided on the resin insulating layer 4, this makes it difficult to obtain a desirable heat radiation through the resin insulating layer 4 because the resin has generally a low heat conductivity.

Further, it is difficult to obtain a highly accurate uniformity in thickness of the resin layer over entire region thereof, for which reason if, contrary to the present invention, the light emitting device 11 is provided on the resin insulating layer 4, then this makes it difficult to suppress erroneous variation in level of the light emitting device 11. This further makes it difficult to achieve a highly accurate alignment of the light emitting device 11 to the optical fiber.

Furthermore, the resin layer has a high thermal expansion coefficient, for which reason a heat generation from the light emitting device 11 may cause a displacement of the light emitting device 11 due to expansion of the resin layer if the light emitting device 11 is provided over the resin layer. This displacement of the light emitting device 11 makes it difficult to obtain a desirable optical coupling between the light emitting device 11 and the optical fiber.

On the other hand, the light receiving device 6 has a relatively large light-receiving area which accepts a slight displacement of the light receiving device 6 even if the resin insulating layer 4 shows a thermal expansion. If the light receiving device 6 has the light-receiving area on its bottom side, then no deterioration in sensitivity of the light receiving device 6 appears.

In accordance with the first embodiment, the light emitting device 11 is provided directly on the interconnection pattern 8. Notwithstanding, it is possible that the light emitting device 11 may optionally be provided directly on the silicon oxide film 2 if the light emitting device 11 has two electrodes facing to the surface of the silicon platform substrate 1.

Figure 5A:
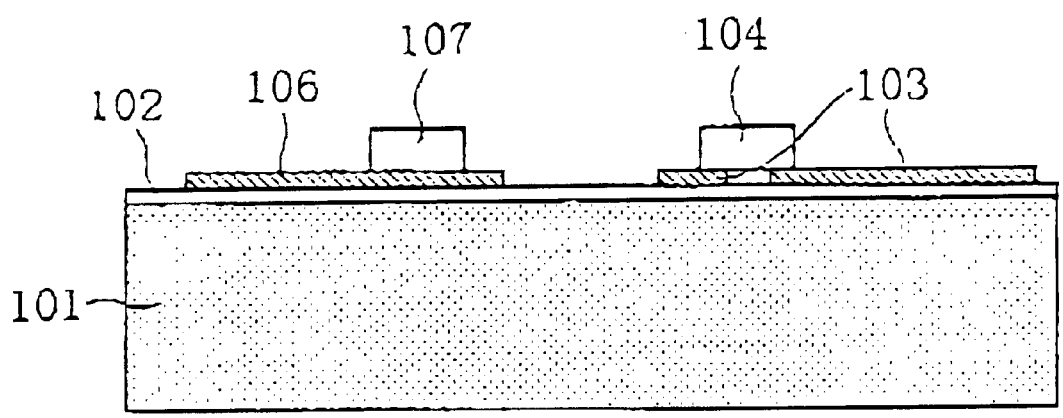
FIG. 5A is a cross sectional elevation view of a first conventional type optical transmitter-receiver module as a first comparative example to the present invention.
Figure 5B:
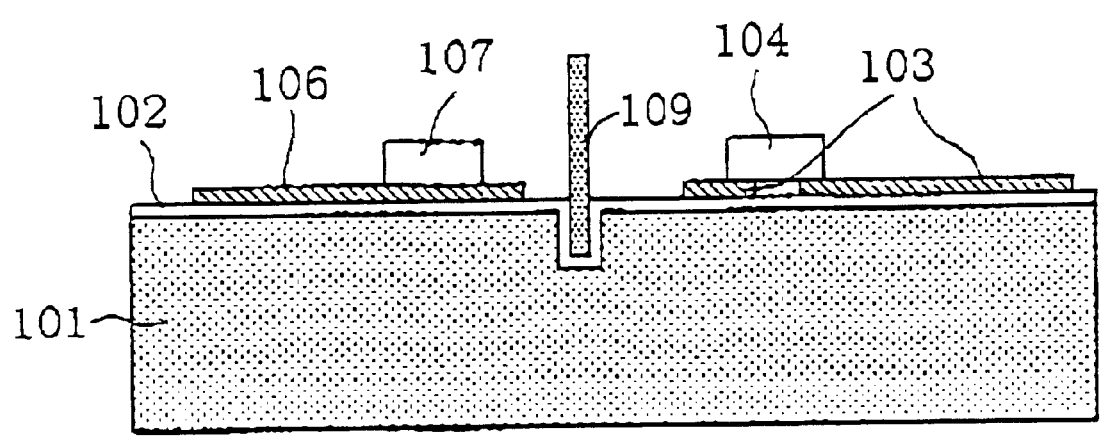
FIG. 5B is a cross sectional elevation view of a second conventional type optical transmitter-receiver module as a second comparative example to the present invention.
Figure 5C:
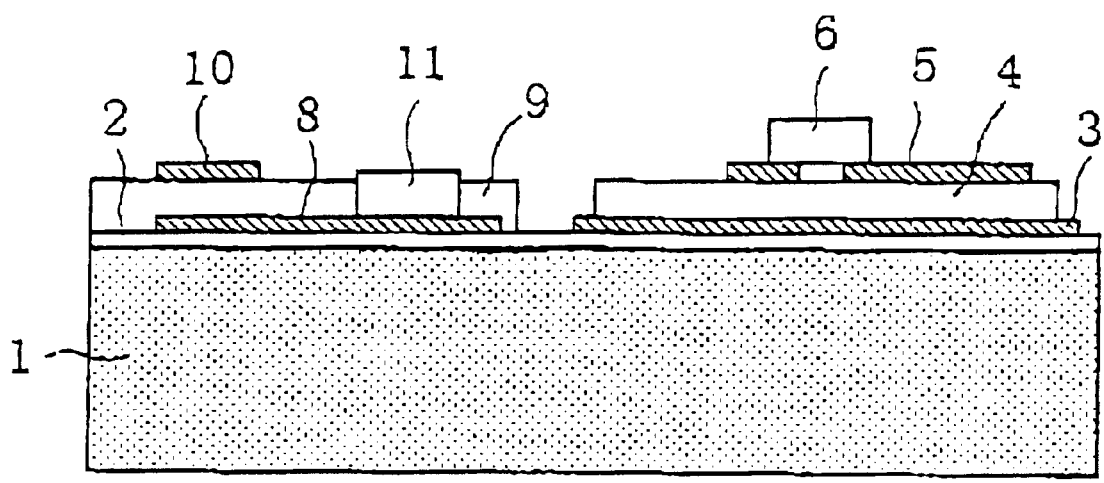
FIG. 5C is a cross sectional elevation view of a first novel type optical transmitter-receiver module as a first example of the present invention.
Figure 5D:
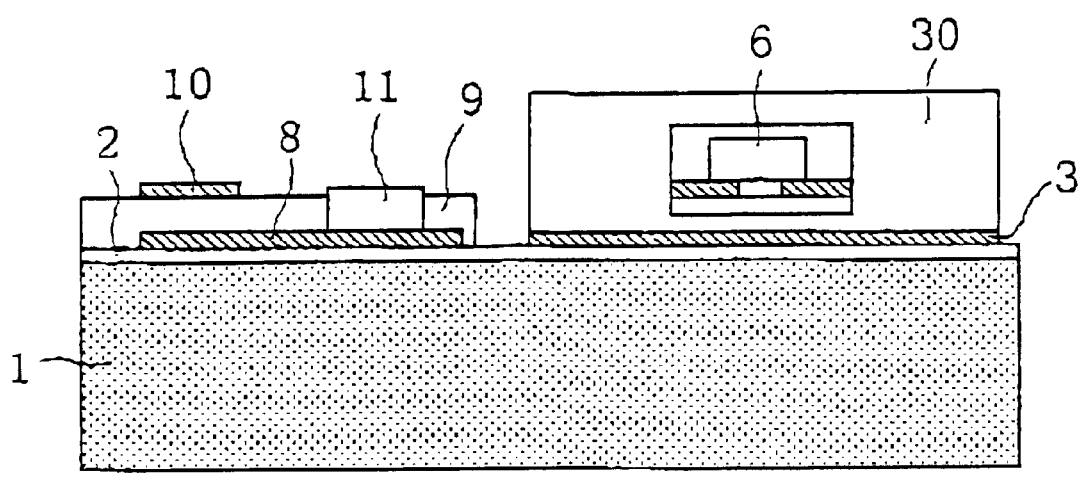
FIG. 5D is a cross sectional elevation view of a first novel type optical transmitter-receiver module as a first example of the present invention.

Optical transmitter-receiver modules of different four types were simulated in crosstalk. FIG. 5A is a cross sectional elevation view of a first conventional type optical transmitter-receiver module as a first comparative example to the present invention. The first conventional type optical transmitter-receiver module has the same structure as described with reference to FIG. 1, except for no shielding plate. FIG. 5B is a cross sectional elevation view of a second conventional type optical transmitter-receiver module as a second comparative example to the present invention. The second conventional type optical transmitter-receiver module has the same structure as described with reference to FIG. 1, wherein the shielding plate 109 is provided between the optical transmitter circuit region and the optical receiver circuit region. FIG. 5C is a cross sectional elevation view of a first novel type optical transmitter-receiver module as a first example of the present invention. The first novel type optical transmitter-receiver module has the same structure as described with reference to FIG. 3, except for no electrically conductive shielding cover. FIG. 5D is a cross sectional elevation view of a first novel type optical transmitter-receiver module as a first example of the present invention.

The second novel type optical transmitter-receiver module has the same structure as described with reference to FIG. 3, wherein the entirety of the optical receiver circuit is covered by the electrically conductive shielding cover 30.

Figure 6:
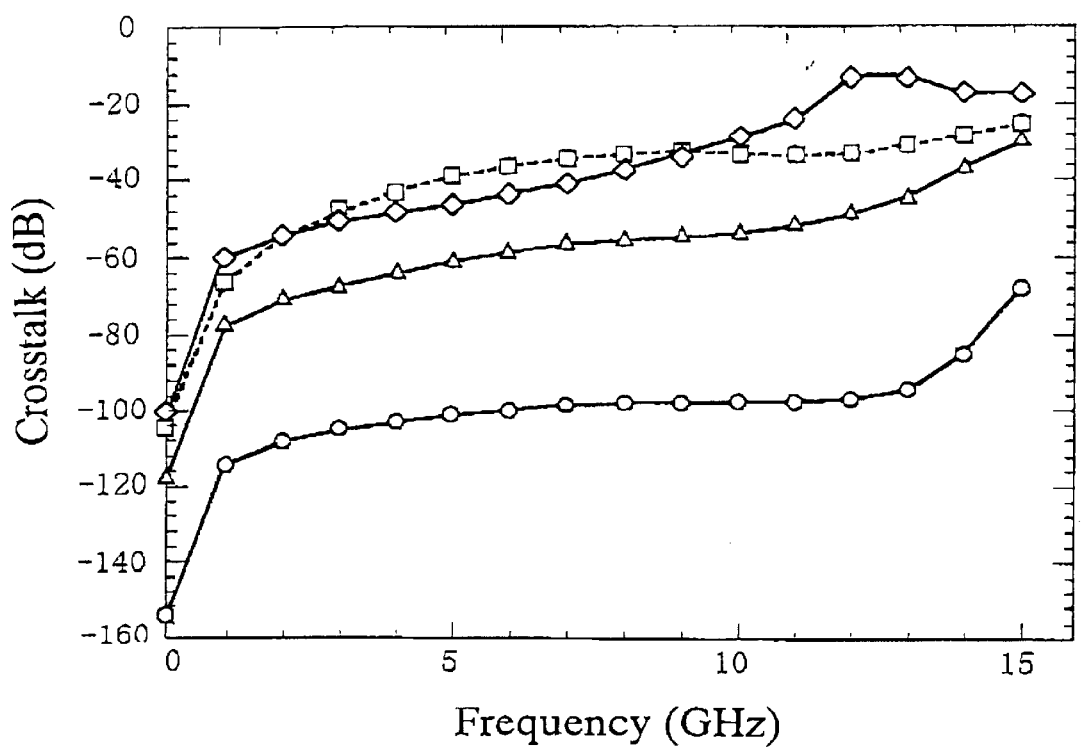
FIG. 6 is a diagram illustrative of results of crosstalk simulations which show variations in crosstalk over frequency of the four different types optical transmitter-receiver modules of FIGS. 5A, 5B, 5C and 5D.

FIG. 6 is a diagram illustrative of results of crosstalk simulations which show variations in crosstalk over frequency of the four different types optical transmitter-receiver modules of FIGS. 5A, 5B, 5C and 5D. The crosstalk simulations were made using a three dimensional electromagnetic field simulator. Mark "□" represents crosstalk variations over frequency of the first conventional type optical transmitter-receiver module shown in FIG. 5A. Mark "◊" represents crosstalk variations over frequency of the second conventional type optical transmitter-receiver module shown in FIG. 5B. Mark "Δ" represents crosstalk variations over frequency of the first novel type optical transmitter-receiver module shown in FIG. 5C. Mark "○" represents crosstalk variations over frequency of the second novel type optical transmitter-receiver module shown in FIG. 5D.

The second novel type optical transmitter-receiver module shown in FIG. 5D shows lowest crosstalk values at various frequencies as compared to the other three types optical transmitter-receiver modules. The first novel type optical transmitter-receiver module shown in FIG. 5C shows next lower crosstalk values at various frequencies as compared to the first and second conventional types optical transmitter-receiver modules. For example, at a frequency of 10 GHz, the crosstalk value of the second novel type optical transmitter-receiver module shown in FIG. 5D is lower by about 60 dB than the crosstalk value of the first conventional optical transmitter-receiver module shown in FIG. 5A. At the frequency of 10 GHz, the crosstalk value of the second novel type optical transmitter-receiver module shown in FIG. 5D is also lower by about 60 dB than the crosstalk value of the second conventional optical transmitter-receiver module shown in FIG. 5B. At the frequency of 10 GHz, the crosstalk value of the second novel type optical transmitter-receiver module shown in FIG. 5D is still lower by about 40 dB than the crosstalk value of the first novel type optical transmitter-receiver module shown in FIG. 5C. In the frequency band lower than 12 GHz, the crosstalk value of the second novel type optical transmitter-receiver module shown in FIG. 5D is suppressed within about −100 dB. In the frequency band lower than 13 GHz, the crosstalk value of the second novel type optical transmitter-receiver module shown in FIG. 5D is suppressed within about −90 dB. In the frequency band lower than 14 GHz, the crosstalk value of the second novel type optical transmitter-receiver module shown in FIG. 5D is suppressed within about −80 dB. The results of the crosstalk simulations show that the novel structure of the optical transmitter-receiver module of FIGS. 3 and 4 are effective to reduce the crosstalk.

Figure 7A:
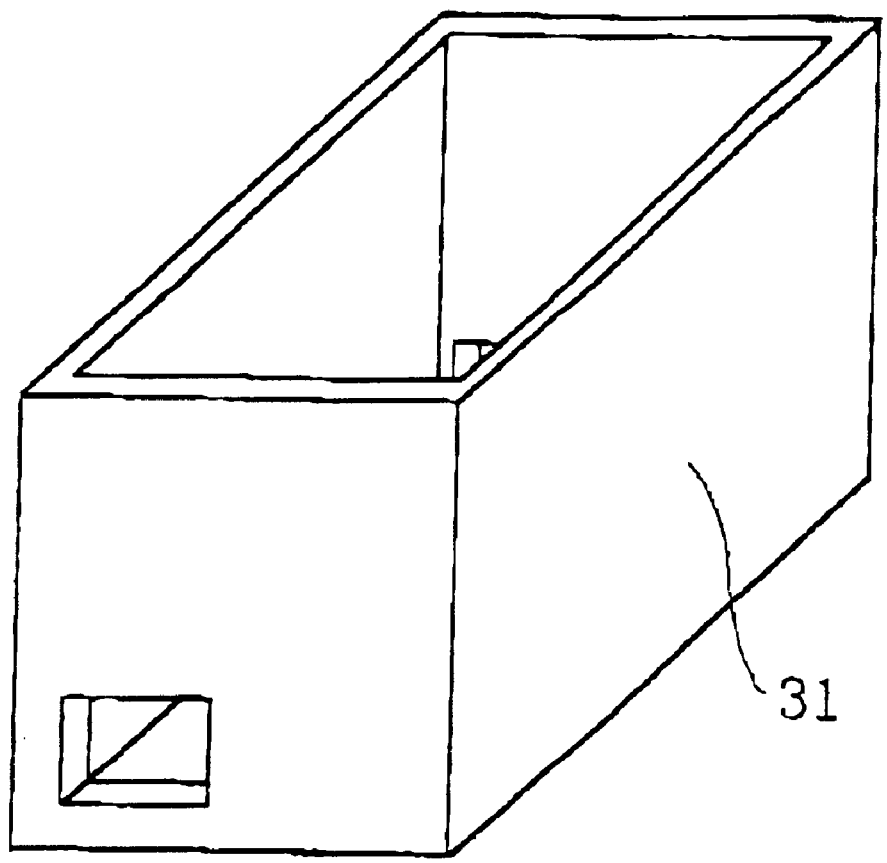
FIG. 7A is a schematic perspective view of a first-modified electrically conductive shielding cover applicable to the optical transmitter-receiver module.
Figure 7B:
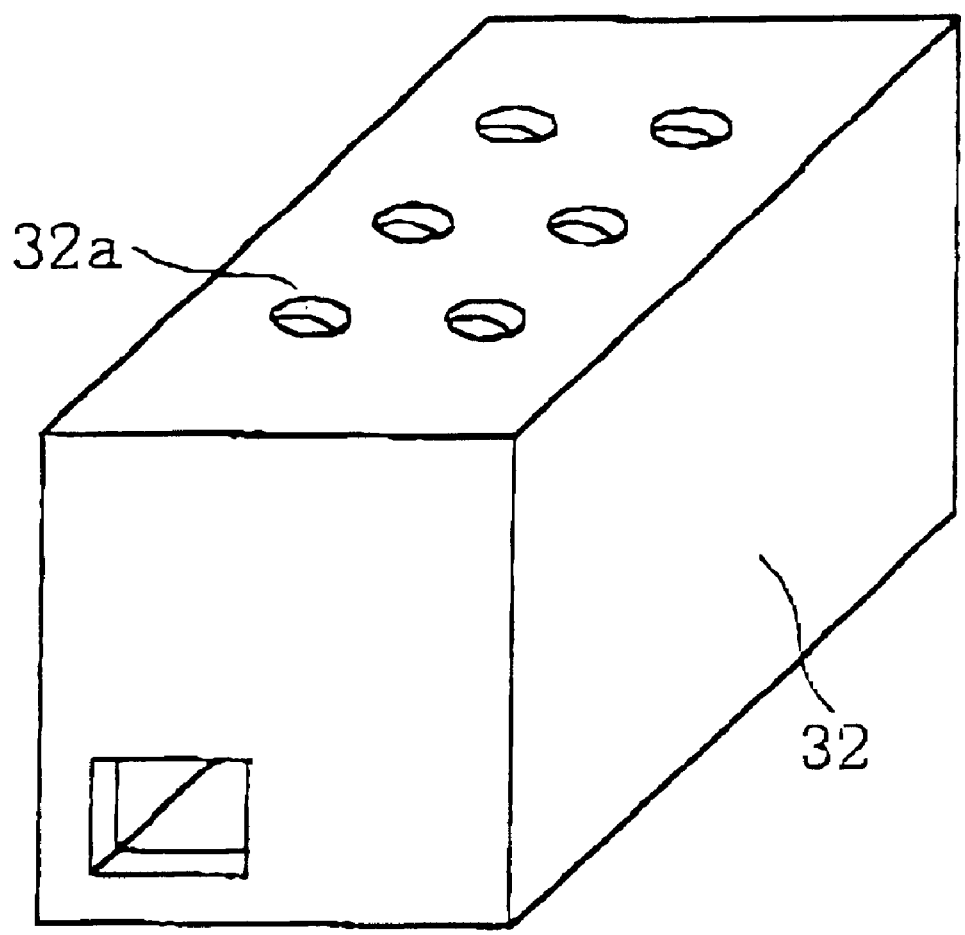
FIG. 7B is a schematic perspective view of a second-modified electrically conductive shielding cover applicable to the optical transmitter-receiver module.
Figure 7C:
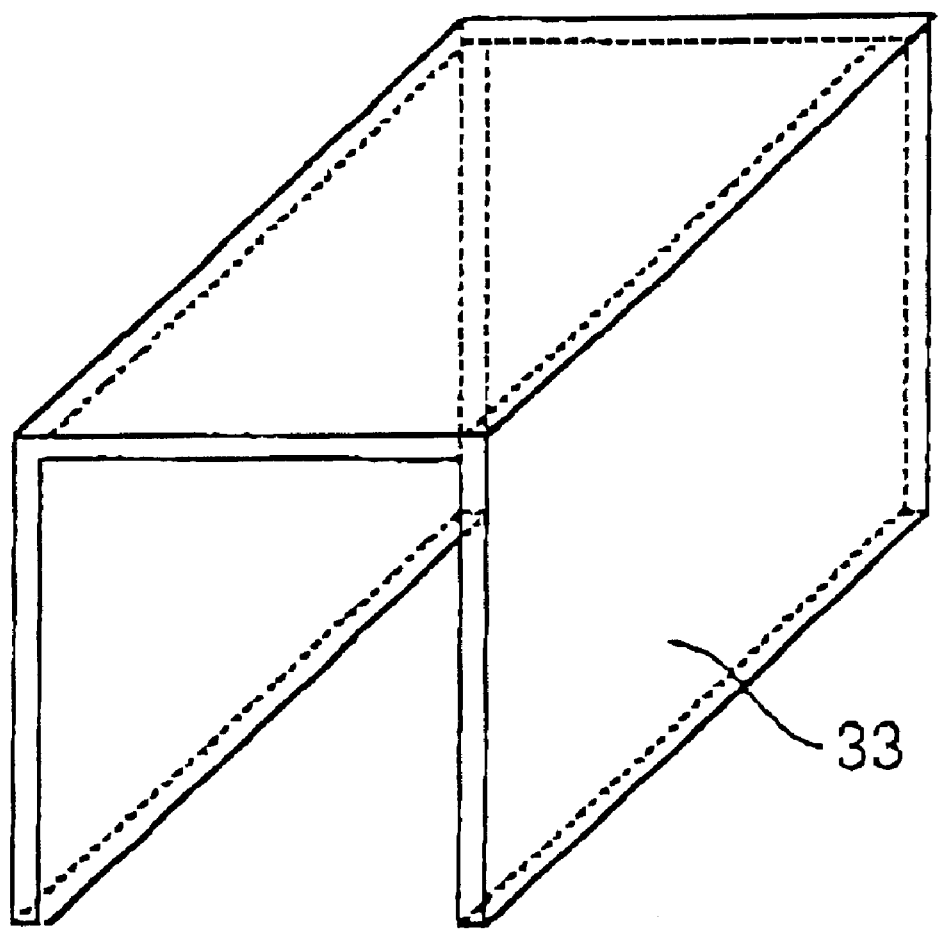
FIG. 7C is a schematic perspective view of a third-modified electrically conductive shielding cover applicable to the optical transmitter-receiver module.
Figure 7D:
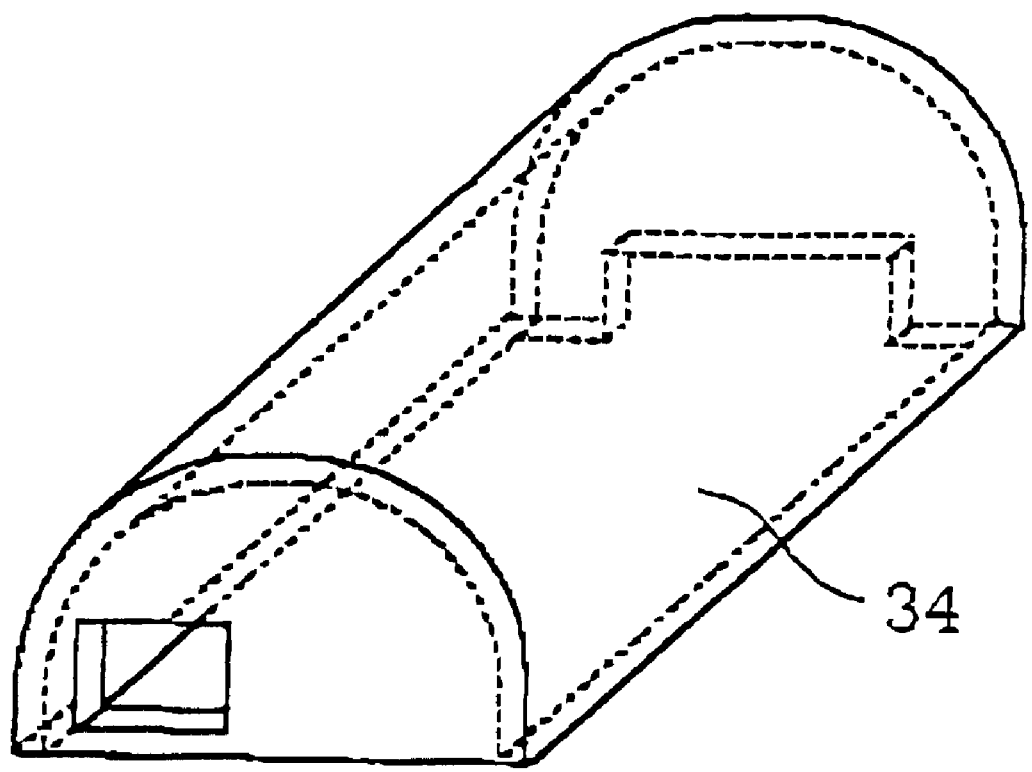
FIG. 7D is a schematic perspective view of a fourth-modified electrically conductive shielding cover applicable to the optical transmitter-receiver module.
Figure 7E:
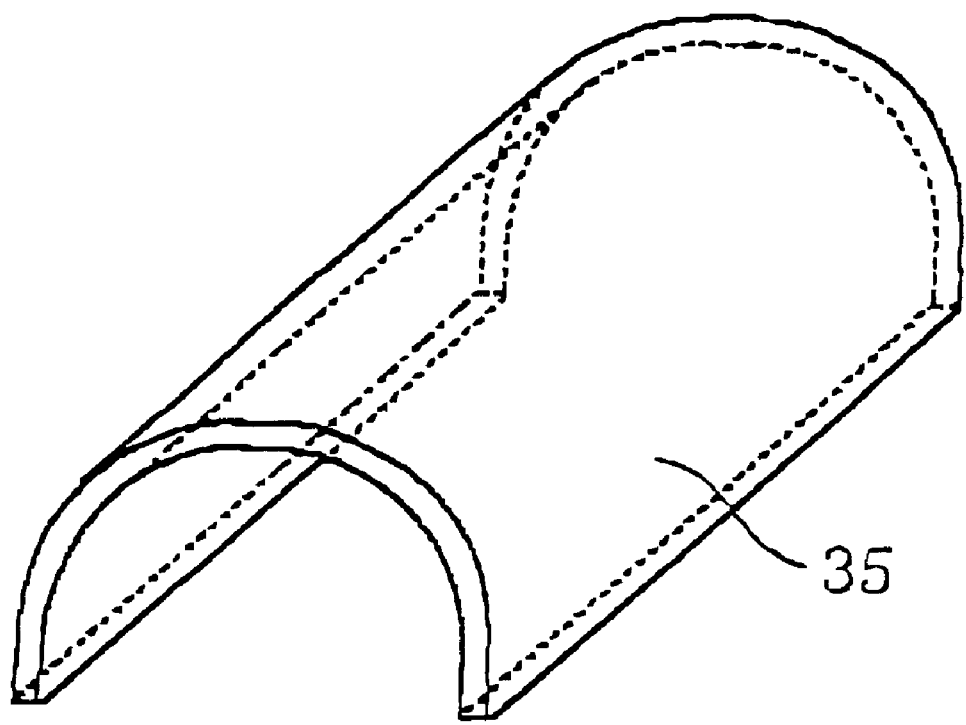
FIG. 7E is a schematic perspective view of a fifth-modified electrically conductive shielding cover applicable to the optical transmitter-receiver module.

The above-described electrically conductive shielding cover 30 has the bottom-opened box shape as shown in FIGS. 3 and 4. This electrically conductive shielding cover 30 may optionally be modified for satisfying various requirements or conditions. FIG. 7A is a schematic perspective view of a first-modified electrically conductive shielding cover applicable to the optical transmitter-receiver module. A first-modified electrically conductive shielding cover 31 has a top-and-bottom-opened box shape for improving a heat radiation from the optical receiver circuit region. FIG. 7B is a schematic perspective view of a second-modified electrically conductive shielding cover applicable to the optical transmitter-receiver module. A second-modified electrically conductive shielding cover 32 has a bottom-opened box shape with plural vent holes on the top face thereof for improving a heat radiation from the optical receiver circuit region. FIG. 7C is a schematic perspective view of a third-modified electrically conductive shielding cover applicable to the optical transmitter-receiver module. A third-modified electrically conductive shielding cover 33 has a bottom-and-front opened box shape for improving a heat radiation from the optical receiver circuit region. FIG. 7D is a schematic perspective view of a fourth-modified electrically conductive shielding cover applicable to the optical transmitter-receiver module. A fourth-modified electrically conductive shielding cover 34 has a front-and-rear closed half-tube shape. FIG. 7E is a schematic perspective view of a fifth-modified electrically conductive shielding cover applicable to the optical transmitter-receiver module. A fifth-modified electrically conductive shielding cover 35 has a front-opened half-tube shape. The first-modified, second-modified, and third-modified electrically conductive shielding covers may optionally have vent-holes on the face parallel to the light incident direction. If metal lens holders are optionally provided on light-emitting-and-receiving facets of the silicon platform substrate, then it is preferable that the light incident front side of the electrically conductive shielding cover is opened whilst the rear side opposite to the light incident front side is closed as shown in FIGS. 7C and 7E.

In the foregoing embodiments, the optical transmitter-receiver module is designed for light incidence in a parallel direction to the surface of the platform substrate. The present invention is also applicable to other optical transmitter-receiver module designed for light incidence in a vertical direction to the surface of the platform substrate. In the foregoing embodiments, the electrically conductive platform substrate is made of silicon. Various metal platform substrates may optionally be available.

Accordingly, the silicon oxide film 2 as a first insulating layer overlies the silicon platform substrate 1 as an electrically conductive platform substrate, so that the silicon oxide film 2 extends both the optical transmitter circuit region and the optical receiver circuit region. Further, the ground pattern 3 is selectively provided over the silicon oxide film 2 so that the ground pattern 3 extends only in the optical receiver circuit region. The insulating layer 4 as a second insulating layer is also selectively provided over the ground pattern 3, so that the insulating layer 4 extends only in the optical receiver circuit region. The light receiving device 6 the receiver LSI circuit 7 are provided over the insulating layer 4. The electrically conductive shielding cover 30 is further provided directly on the ground pattern 3 for covering the light receiving device 6 the receiver LSI circuit 7. The light emitting device 11 is provided directly on either the silicon oxide film 2 as the first insulating layer overlying the silicon platform substrate 1 or the interconnection pattern 8 over the silicon oxide film 2. The above structure provides the following effects.

First, the crosstalk between the optical transmitter circuit and the optical receiver circuit can be suppressed within −80 dB in the frequency band of not more than 14 GHz even if the electrically conductive platform substrate comprises a silicon substrate which is advantageous in low cost and high heat conductivity.

Second, the light-emitting device is provided directly on either the thin insulating film overlying the silicon platform substrate or the interconnection pattern over the thin insulating film, so that the light-emitting device is thermally coupled through the thin insulating film to the silicon platform substrate having the high heat conductivity, resulting in high heat radiation efficiency from the light-emitting device.

Third, the light-emitting device is provided directly on either the thin insulating film overlying the silicon platform substrate or the interconnection pattern over the thin insulating film, so as to keep a highly accurate level of the light-emitting device and also suppress any substantive displacement of the light-emitting device due to variation of temperature.

Fourth, the light receiving device is provided over the thick insulating film selectively provided in the optical receiver circuit region for facilitating design of coplanar transmission lines for further improvement in high frequency performance of the optical receiver circuit.

Figure 8:
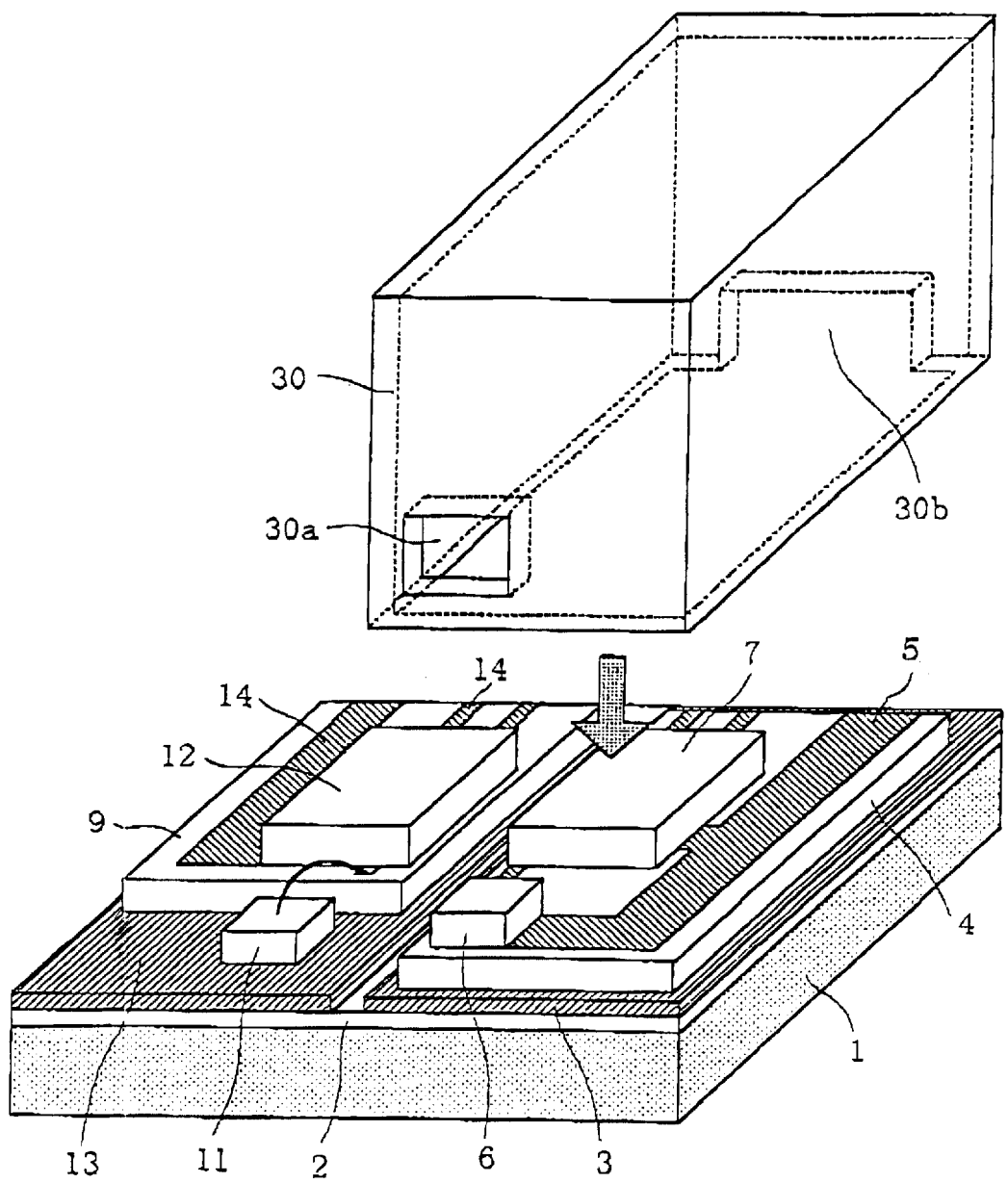
FIG. 8 is a schematic perspective view illustrative of a novel optical transmitter-receiver module in a second embodiment in accordance with the present invention.

Second Embodiment:

A second embodiment according to the present invention will be described in detail with reference to the drawings. FIG. 8 is a schematic perspective view illustrative of a novel optical transmitter-receiver module having an integration of an optical transmitter circuit and an optical receiver circuit over a single platform substrate, wherein the optical receiver circuit has not yet been covered by an electrically conductive shielding cover. The novel optical transmitter-receiver module of this second embodiment has the same structure as in the first embodiment except, however, that an additional ground pattern is provided over the thin insulating layer overlying an entirety of an upper surface of the silicon platform substrate so that the additional ground pattern extends almost the entirety of the optical transmitter circuit region, and also that a coplanar transmission line is provided on a thick insulator selectively provided on the additional ground pattern which is retracted from the light-emitting-and-receiving side.

The novel optical transmitter-receiver module has a silicon platform substrate 1. A silicon oxide film 2 overlies an entirety of an upper surface of the silicon platform substrate 1. A ground conductive pattern 3 is selectively provided which covers almost an entirety of an optical receiver circuit region. Further, a ground conductive pattern 13 is selectively provided which covers almost an entirety of an optical transmitter circuit region. An insulating layer 4 is selectively provided over the ground conductive pattern 3 except over a peripheral region of the ground conductive pattern 3. The insulating layer 4 is made of a polyimide resin. Interconnection patterns 5 are selectively provided over the insulating layer 4. The interconnection patterns 5 include a ground layer, a power transmission layer and a signal transmission layer. A light emitting device 6 and a receiver LSI circuit 7 are also selectively provided over the insulating layer 4.

An additional ground pattern 13 is provided over the silicon oxide film 2, so that the additional ground pattern 13 extends almost the entirety of the optical transmitter circuit region. An insulating layer 9 is selectively provided over the ground pattern 13 and in the optical transmitter circuit region. The insulating layer 9 is retracted from a light emitting facet. Coplanar transmission lines 14 are selectively provided over the insulating layer 9 for improving the high frequency performance of the optical transmitter circuit. A light emitting device 11 is selectively provided directly on the ground pattern 13 in the optical transmitter circuit region. A transmitter LSI circuit 12 is selectively provided directly on the coplanar transmission lines 14 and over the insulating layer 9. The light emitting device 11 is electrically connected through wirings to the transmitter LSI circuit 12. Since the light emitting device 11 is different in level from the transmitter LSI circuit 12, the length of the interconnecting wirings may optionally be shortened in order to improve the high frequency performance of the optical transmitter circuit.

The additional ground pattern 13 ensures shielding the optical transmitter circuit from the optical receiver circuit, thereby preventing coupling between the optical transmitter circuit and the optical receiver circuit through the silicon platform substrate 1 for further reduction to the crosstalk between the optical transmitter circuit and the optical receiver circuit. The coplanar transmission lines 14 further improves the high frequency performance of the optical transmitter circuit.

If the light emitting device 11 has a p-type semiconductor substrate, it is possible as a modification that a power conductive pattern which keeps a power voltage level for shielding the optical transmitter circuit from the optical receiver circuit, thereby preventing coupling between the optical transmitter circuit and the optical receiver circuit through the silicon platform substrate 1 for further reduction to the crosstalk between the optical transmitter circuit and the optical receiver circuit.

FIGS. 9A through 9D are cross sectional elevation views illustrative of the optical transmitter-receiver modules in sequential steps involved in the fabrication method for the optical transceiver module of FIG. 8.

Figure 9A:
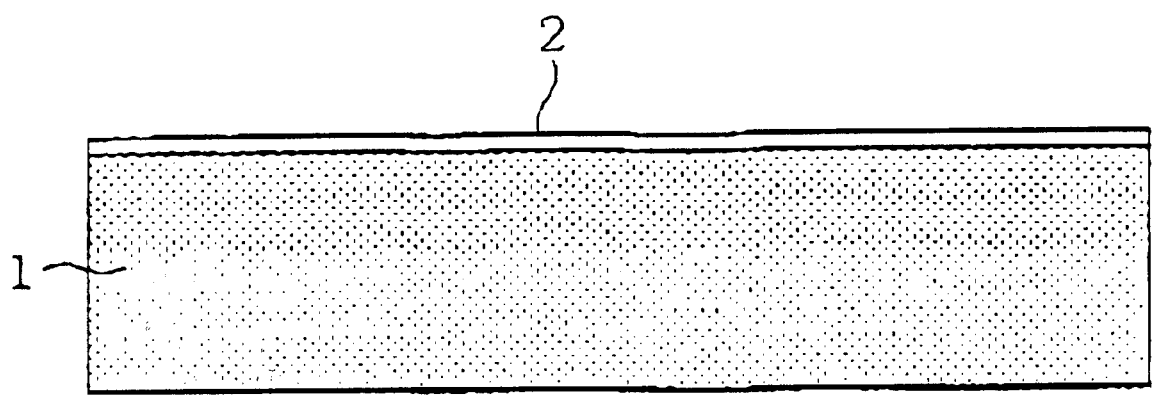
FIGS. 9A through 9D are cross sectional elevation views illustrative of the optical transmitter-receiver modules in sequential steps involved in the fabrication method for the optical transceiver module of FIG.8.

With reference to FIG. 9A, a silicon platform substrate 1 is heat-treated in a wet oxidizing atmosphere for forming a thermal oxide film 2 having a thickness of 1.3 micrometers over the silicon platform substrate 1.

Figure 9B:
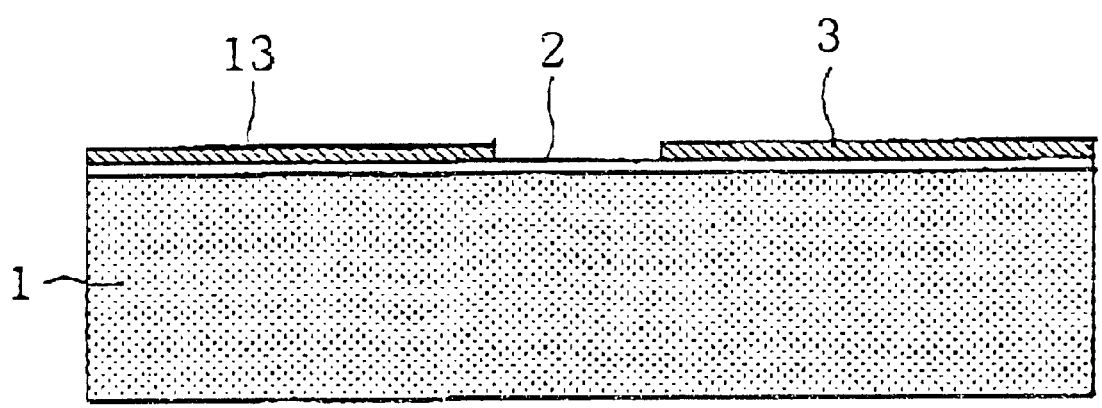

With reference to FIG. 9B, an aluminum film having a thickness of 1 micrometer is entirely deposited over the entire surface of the thermal oxide film 2 by sputtering method. The aluminum film is patterned by lithography and subsequent anisotropic etching processes, whereby ground patterns 13 and 3 are selectively formed in the optical transmitter circuit region and the optical receiver circuit region.

Figure 9C:
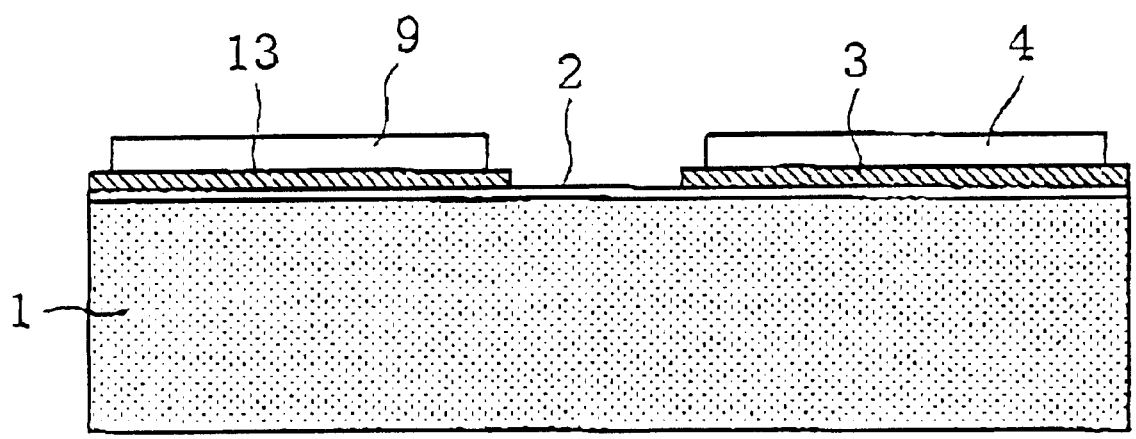

With reference to FIG. 9C, a monomer (polyamic acid) as a precursor of polyimide is spin-coated over the substrate 1, and then heat-treated to form a polyimide resin film having a thickness of about 40 micrometers. The polyimide resin film is then patterned by lithography and subsequent anisotropic etching processes, whereby insulating layers 9 and 4 are selectively formed in the optical transmitter circuit region and the optical receiver circuit region respectively.

Figure 9D:
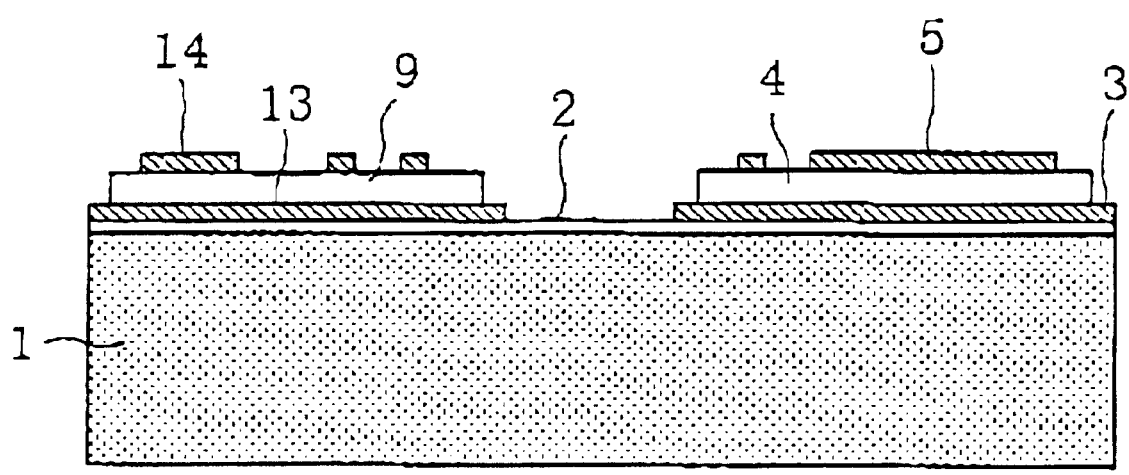

With reference to FIG. 9D, a resist pattern is selectively formed by a lithography technique over the substrate. An aluminum film having a thickness of 1 micrometers is deposited. A lift-off method is carried out or a combined lithography and subsequent etching processes is carried out, thereby selectively forming interconnections 14 and 5 in the optical transmitter circuit region and the optical receiver circuit region respectively.

Subsequently, the light receiving device 6 the receiver LSI circuit 7 are mounted on the optical receiver circuit region, whilst the light emitting device 11 the transmitter LSI circuit 12 are mounted on the optical transmitter circuit region. The light receiving device 6 is wire-boned to the receiver LSI circuit 7. The light emitting device 11 is also wire-boned to the transmitter LSI circuit 12. The electrically conductive shielding cover 30 is fixed to the ground pattern 3 by using solder or electrically conductive paste.

It is possible as a modification that in place of polyimide, other electrically insulative resins such as benzocyclobutene are available, and in place of aluminum, copper or gold are also available.

Accordingly, the silicon oxide film 2 as a first insulating layer overlies the silicon platform substrate 1 as an electrically conductive platform substrate, so that the silicon oxide film 2 extends both the optical transmitter circuit region and the optical receiver circuit region. Further, the ground pattern 3 is selectively provided over the silicon oxide film 2 so that the ground pattern 3 extends only in the optical receiver circuit region. The insulating layer 4 as a second insulating layer is also selectively provided over the ground pattern 3, so that the insulating layer 4 extends only in the optical receiver circuit region. The light receiving device 6 the receiver LSI circuit 7 are provided over the insulating layer 4. The electrically conductive shielding cover 30 is further provided directly on the ground pattern 3 for covering the light receiving device 6 the receiver LSI circuit 7. The light emitting device 11 is provided directly on the ground pattern 13 over the silicon oxide film 2. The above structure provides the following effects.

First, the crosstalk between the optical transmitter circuit and the optical receiver circuit can be suppressed within −80 dB in the frequency band of not more than 14 GHz even if the electrically conductive platform substrate comprises a silicon substrate which is advantageous in low cost and high heat conductivity.

Second, the light-emitting device is provided directly on either the thin insulating film overlying the silicon platform substrate or the interconnection pattern over the thin insulating film, so that the light-emitting device is thermally coupled through the thin insulating film to the silicon platform substrate having the high heat conductivity, resulting in high heat radiation efficiency from the light-emitting device.

Third, the light-emitting device is provided directly on either the thin insulating film overlying the silicon platform substrate or the interconnection pattern over the thin insulating film, so as to keep a highly accurate level of the light-emitting device and also suppress any substantive displacement of the light-emitting device due to variation of temperature.

Fourth, the light receiving device is provided over the thick insulating film selectively provided in the optical receiver circuit region for facilitating design of coplanar transmission lines for further improvement in high frequency performance of the optical receiver circuit.

Figure 10:
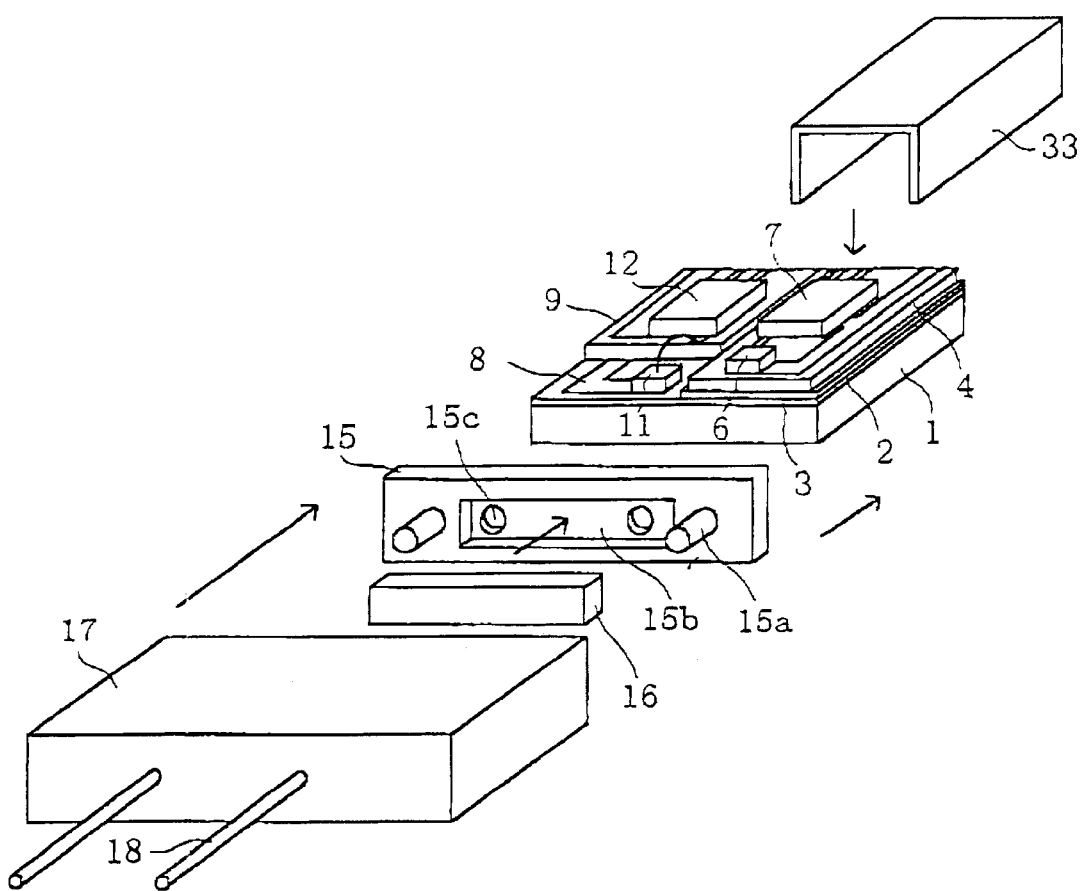
FIG. 10 is a schematic perspective view illustrative of decomposed optical transmitter-receiver module, lens holder, and optical connector in a third embodiment in accordance with the present invention.
Figure 11:
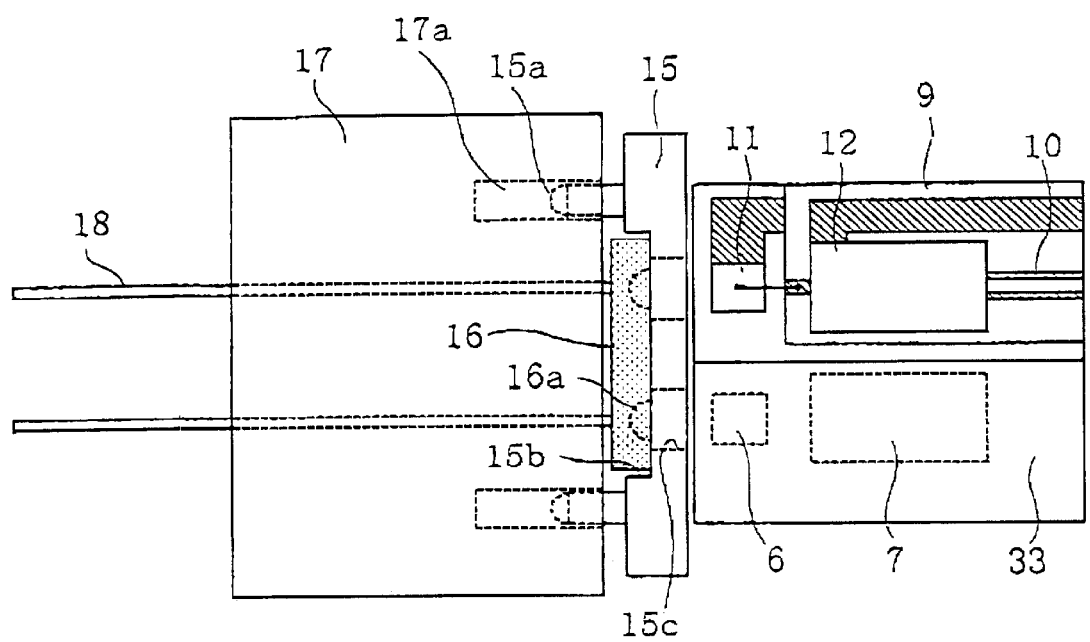
FIG. 11 is a plane view illustrative of the assembled optical transmitter-receiver module, lens holder, and optical connector of FIG. 10.

Third Embodiment:

A third embodiment according to the present invention will be described in detail with reference to the drawings. FIG. 10 is a schematic perspective view illustrative of decomposed optical transmitter-receiver module, lens holder, and optical connector. FIG. 11 is a plane view illustrative of the assembled optical transmitter-receiver module, lens holder and optical connector of FIG. 10. The optical transmitter-receiver module has the same structure as described in the first embodiment with reference to FIG. 3. An electrically conductive shielding cover 33 has a bottom, front and rear-opened box-shape. The electrically conductive shielding cover 33 covers the light receiving device 6 the receiver LSI circuit 7 in the optical receiver circuit region.

A metal lens holder 15 is placed in the front side of the optical transmitter-receiver module. The metal lens holder 15 has two pin holes 15c for allowing light incidence into the light receiving device 6 and also light emission from the light emitting device 11. The metal lens holder 15 has a first face confronting with the optical transmitter-receiver module, and a second face opposite to the first face. The second face of the metal lens holder 15 has a recess 15b which receives a plane lens array 16. The second face of the metal lens holder 15 also has projection members 15a which are inserted into engagement holes 17a of the optical connector 17 for positioning the optical connector 17 to the metal lens holder 15. The metal lens holder 15 is grounded. The metal lens holder 15 is contact directly with the electrically conductive shielding cover 33.

The plane lens array 16 may be adhered into the recess 15b of the metal lens holder 15 by using an adhesive agent or by combined plating a surface of the plane lens array 16 and subsequent soldering the same. The plane lens array 16 includes two lenses 16a which face to the light receiving device 6 and the light emitting device 11. A focal length of the lenses 16a is designed so that a light emitted from the light emitting device 11 is focused on the terminal of the optical fiber 18 held by the optical connector 17. Those lenses 16a may be formed from a glass substrate by a lithography technique and an ion-exchange method.

The optical connector 17 holds the optical fibers 18. The optical connector 17 is made of an optical shielding resin material which contains an light-absorbing additive such as a black pigment, wherein the optical connector 17 unites the optical fibers 18. The optical connector 17 has a first face confronting with the lens holder 15, and a second face opposite to the first face. Terminals of the optical fibers 18 project from the first face of the optical connector 17 by a predetermined length, for example, about 10 micrometers. The projection members 15a of the metal lens holder 15 are inserted into the engagement holes 17a of the optical connector 17 for positioning the optical connector 17 to the metal lens bolder 15, whereby the terminals of the optical fibers 18 are contact directly with the face of the plane lens array 16.

An undesirable electromagnetic wave is generated by pulse-driving the light emitting device. The metal lens holder 15 with a thickness of about 0.3 mm shields the propagation of the generated electromagnetic wave through the front side of the optical transmitter-receiver module toward the optical receiver circuit region, whereby the crosstalk between the optical transmitter circuit and the optical receiver circuit can be suppressed. The pin holes 15c of the metal lens holder 15 may be reduced in diameter down to a diameter of laser beam, for example, about 200–300 micrometers, so that the pin holes 15c cause substantially no electromagnetic noises. The metal lens hold 15 is grounded to keep a ground potential. The metal lens holder 15 also shields a propagation of a stray light from the light emitting device 11 toward the optical receiver circuit region, whereby an optical crosstalk between the optical transmitter circuit region and the optical receiver circuit region can also be suppressed.

In this third embodiment, the metal lens holder 15 and the electrically conductive shielding cover 33 are not connected to each other electrically and mechanically, but are in contact directly with each other. It is possible as a modification that the metal lens holder and the electrically conductive shielding cover are connected to each other electrically and mechanically by using a solder or electrically conductive paste. It is also possible a further modification that the metal lens holder and the electrically conductive shielding cover are in the form of a single united member.

Accordingly, the silicon oxide film 2 as a first insulating layer overlies the silicon platform substrate 1 as an electrically conductive platform substrate, so that the silicon oxide film 2 extends both the optical transmitter circuit region and the optical receiver circuit region. Further, the ground pattern 3 is selectively provided over the silicon oxide film 2 so that the ground pattern 3 extends only in the optical receiver circuit region. The insulating layer 4 as a second insulating layer is also selectively provided over the ground pattern 3, so that the insulating layer 4 extends only in the optical receiver circuit region. The light receiving device 6 the receiver LSI circuit 7 are provided over the insulating layer 4. The electrically conductive shielding cover 33 is further provided directly on the ground pattern 3 for covering the light receiving device 6 the receiver LSI circuit 7. The light emitting device 11 is provided directly on either the silicon oxide film 2 as the first insulating layer overlying the silicon platform substrate 1 or the interconnection pattern 8 over the silican oxide film 2. The above structure provides the following effects.

First, the crosstalk between the optical transmitter circuit and the optical receiver circuit can be suppressed within −80 dB in the frequency band of not more than 14 GHz even if the electrically conductive platform substrate comprises a silicon substrate which Is advantageous in low cost and high heat conductivity.

Second, the light-emitting device is provided directly on either the thin insulating film overlying the silicon platform substrate or the interconnection pattern over the thin insulating film, so that the light-emitting device is thermally coupled through the thin insulating film to the silicon platform substrate having the high heat conductivity, resulting in high heat radiation efficiency from the light-emitting device.

Third, the light-emitting device is provided directly on either the thin insulating film overlying the silicon platform substrate or the interconnection pattern over the thin insulating film, so as to keep a highly accurate level of the light-emitting device and also suppress any substantive displacement of the light-emitting device due to variation of temperature.

Fourth, the light receiving device is provided over the thick insulating film selectively provided in the optical receiver circuit region for facilitating design of coplanar transmission lines for further improvement in high frequency performance of the optical receiver circuit.

Figure 12:
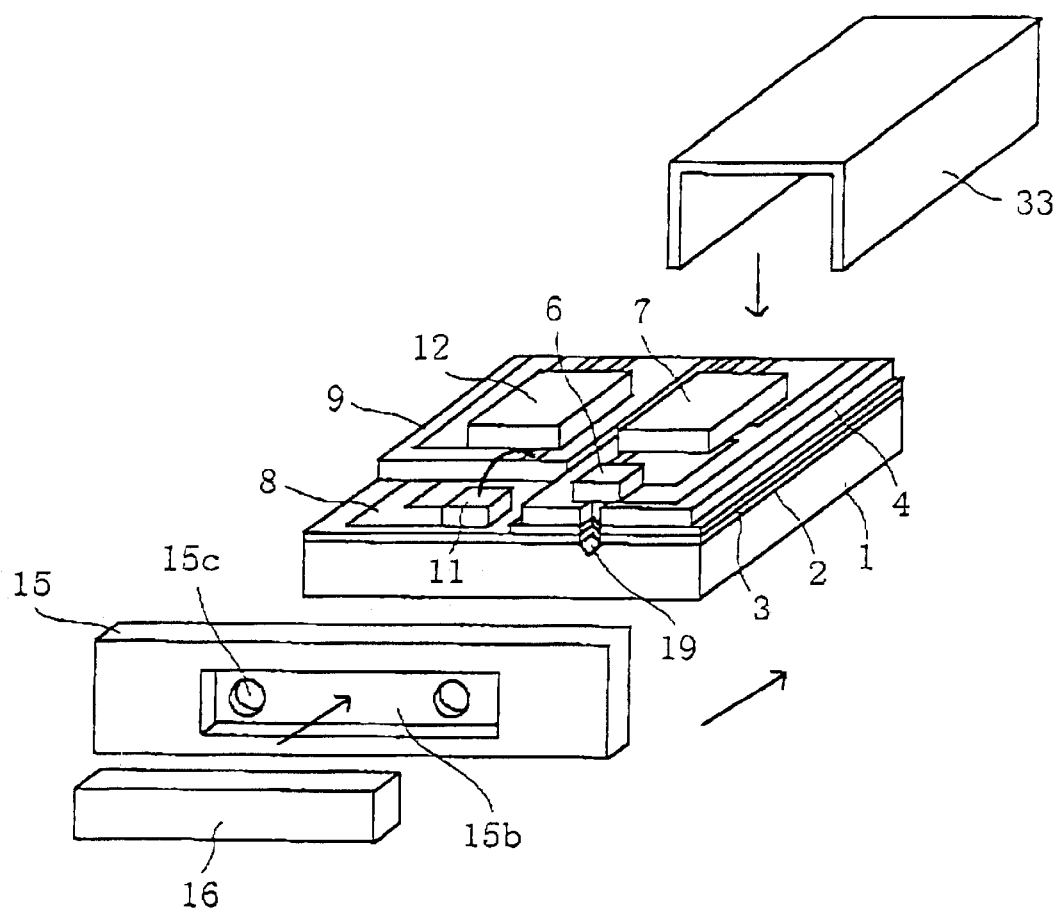
FIG. 12 is a schematic perspective view illustrative of decomposed optical transmitter-receiver module, and lens holder in a fourth embodiment in accordance with the present invention.

Fourth Embodiment:

A fourth embodiment according to the present invention will be described in detail with reference to the drawings. FIG. 12 is a schematic perspective view illustrative of decomposed optical transmitter-receiver module, and lens holder in a fourth embodiment in accordance with the present invention. The metal lens holder 15 and the plane lens array 16 are identical with those in the third embodiment. The electrically conductive shielding cover 33 is also identical with that in the third embodiment. The optical transmitter-receiver module of this embodiment has the same structure as what has been described in the third embodiment except, however, that an optical transmission groove is further provided under the light receiving device.

An optical transmission groove 19 is selectively provided which penetrates the insulating layer 4, the ground pattern 3, and the silicon oxide film 2 and reaches the silicon platform substrate 1, wherein a top of the optical transmission groove 19 is bounded with the bottom of the light receiving device 6. The optical transmission groove 19 has a groove termination which is positioned under the light receiving device 6. The light receiving device 6 has a bottom face including a light receiving area. The optical transmission groove 19 has a V-shaped bottom in the silicon platform substrate 1. The groove termination has a sloped bottom-terminal face in the silicon platform substrate 1, wherein the sloped bottom-terminal face is positioned under the light receiving area on the bottom face of the light receiving device 6, so that an incident light into the optical transmission groove 19 is reflected by the sloped bottom face and transmitted toward the light receiving area on the bottom face of the light receiving device 6.

Namely, a light propagated through the optical fiber is transmitted through the pinhole 15c of the lens holder 15 and then incident into the optical transmission groove 19. The incident light is further transmitted through the optical transmission groove 19 toward the sloped bottom-terminal face, and then reflected by the sloped bottom-terminal face. The reflected light is further transmitted through the optical transmission groove 19 toward the light receiving area on the bottom face of the light receiving device 6. As a result, the light is incident into the light receiving area on the bottom face of the light receiving device 6.

FIGS. 13A through 13E are cross sectional elevation views of platform substrates in sequential steps involved in a novel method of forming a modified platform substrate with an optical transmission groove shown in FIG. 12.

Figure 13A:
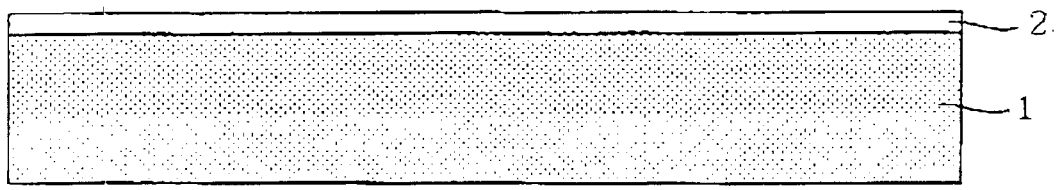
FIGS. 13A through 13E are cross sectional elevation views of platform substrates in sequential steps involved in a novel method of forming a modified platform substrate with an optical transmission groove shown in FIG. 12.

With reference to FIG. 13A, silicon platform substrate 1 with a main face (100) is heat-treated in an oxidizing atmosphere to form a thermal oxide film 2 having a thickness of 1.3 micrometers.

Figure 13B:
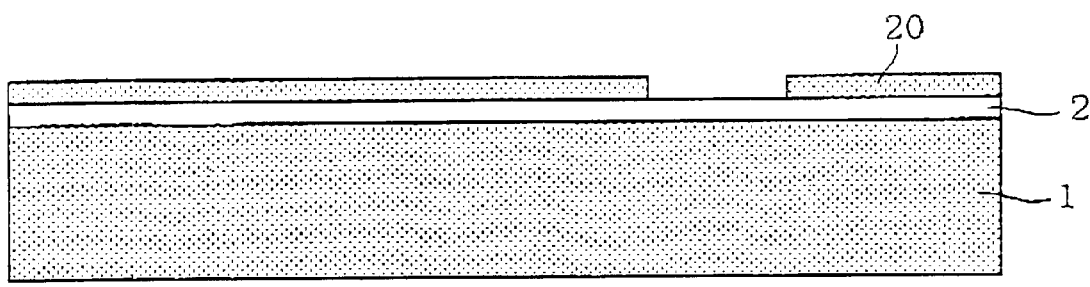

With reference to FIG. 13B, a resist film 20 with an opening is formed over the thermal oxide film 2 by use of a lithography technique, wherein a longitudinal direction of the opening is parallel to a <110>-direction.

Figure 13C:
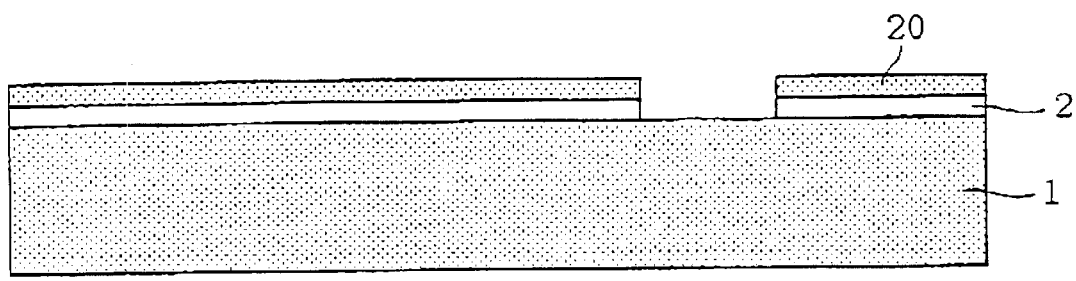

With reference to FIG. 13C, the thermal oxide film 2 is selectively etched with a buffered hydrofluoric acid by using the resist film 20 as a mask, to form an opening in the thermal oxide film 2, whereby a part of the top surface of the silicon platform substrate 1 is shown through the openings.

Figure 13D:
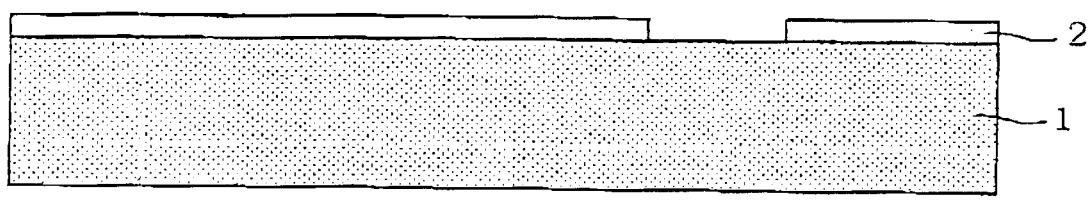

With reference to FIG. 13D, the used resist film 20 is removed by an ashing method.

Figure 13E:
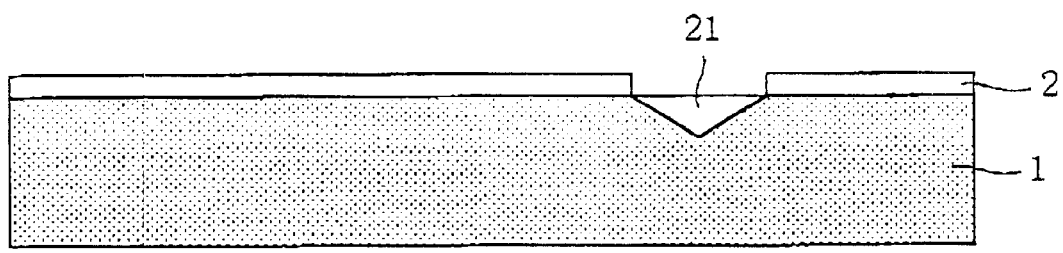

With reference to FIG. 13E, the silicon platform substrate 1 is selectively etched by an etchant of KOH by using the thermal oxide film 2 with the opening as a mask, thereby forming a V-shaped groove 21 in the silicon platform substrate 1 and under the opening of the thermal oxide film 2. Three (111)-faces appear in the V-shaped groove 21 of the silicon platform substrate 1. Facing two of the three (111)-faces are illustrated in FIG. 13E, whilst the remaining one (111)-face not illustrated forms the above-described reflecting face for reflecting the incident light toward the light receiving area on the bottom face of the light receiving device 6. The remaining one (111)-face acting as the reflecting face may optionally be metalized, for example, with Au by a sputtering method.

Subsequently, the same processes as described with reference to FIGS. 9C and 9D are conducted, provided that the optical transmission groove 19 is additionally formed by selective removals of the insulating layer 4 and the ground pattern 3 over the V-shaped groove 21.

Accordingly, the silicon oxide film 2 as a first insulating layer overlies the silicon platform substrate 1 as an electrically conductive platform substrate, so that the silicon oxide film 2 extends both the optical transmitter circuit region and the optical receiver circuit region. Further, the ground pattern 3 is selectively provided, over the silicon oxide film 2 so that the ground pattern 3 extends only in the optical receiver circuit region. The insulating layer 4 as a second insulating layer is also selectively provided over the ground pattern 3, so that the insulating layer 4 extends only in the optical receiver circuit region. The light receiving device 6 the receiver LSI circuit 7 are provided over the insulating layer 4. The electrically conductive shielding cover 33 is further provided directly on the ground pattern 3 for covering the light receiving device 6 the receiver LSI circuit 7. The light emitting device 11 is provided directly on either the silicon oxide film 2 is the first insulating layer overlying the silicon platform substrate 1 or the interconnection pattern 8 over the silicon oxide film 2. The above structure provides the following effects.

First, the crosstalk between the optical transmitter circuit and the optica receiver circuit can be suppressed within −80 dB in the frequency band of not more than 14 GHz even if the electrically conductive platform substrate comprises a silicon substrate which is advantageous in low cost and high heat conductivity.

Second, the light-emitting device is provided directly on either the thin insulating film overlying the silicon platform substrate or the interconnection pattern over the thin insulating film, so that the light-emitting device is thermally coupled through the thin insulating film to the silicon platform substrate having the high heat conductivity, resulting in high heat radiation efficiency from the light-emitting device.

Third, the light-emitting device is provided directly on either the thin insulating film overlying the silicon platform substrate or the interconnection pattern over the thin insulating film, so as to keep a highly accurate level of the light-emitting device and also suppress any substantive displacement of the light-emitting device due to variation of temperature.

Fourth, the light receiving device is provided over the thick insulating film selectively provided in the optical receiver circuit region for facilitating design of coplanar transmission lines for further improvement in high frequency performance of the optical receiver circuit.

Figure 14:
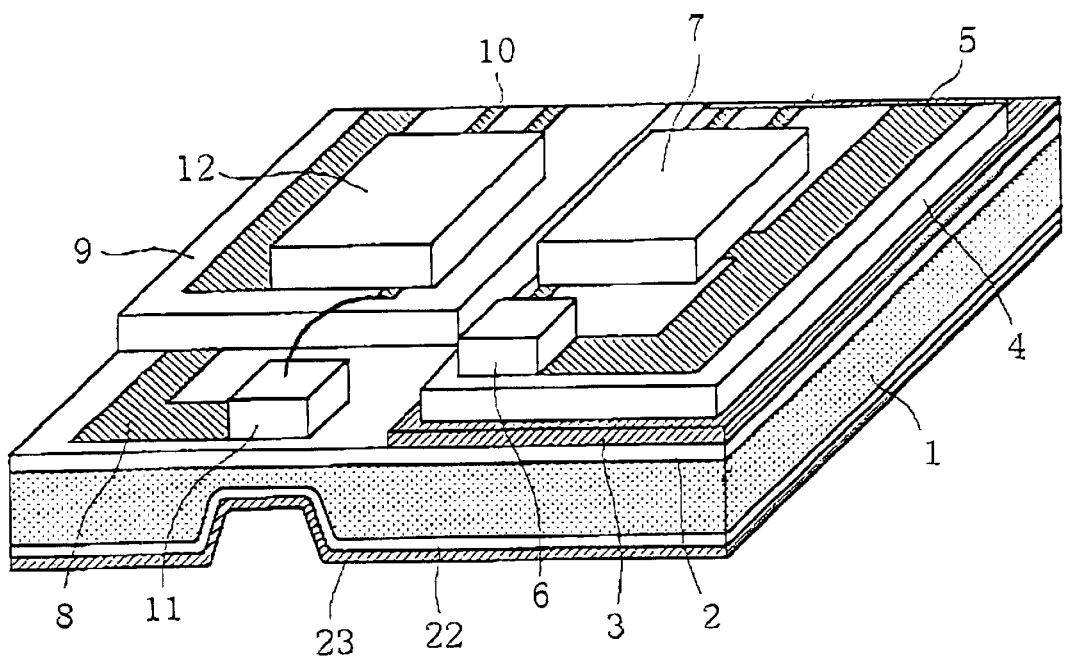
FIG. 14 is a schematic perspective view illustrative of a novel optical transmitter-receiver module in a fifth embodiment in accordance with the present invention.

Fifth Embodiment:

A fifth embodiment according to the present invention will be described in detail with reference to the drawings. FIG. 14 is a schematic perspective view illustrative of a novel optical transmitter-receiver module in a fifth embodiment in accordance with the present invention. In FIG. 14, the illustrations of the lens holder and the electrically conductive shielding cover are omitted. The optical transmitter-receiver module of this embodiment has the same structure as described in the first embodiment with reference to FIGS. 3 and 4 except, however, that the following modified structures. The silicon platform substrate 1 has a bottom which includes a recess which is positioned under the light emitting device 11, so that the silicon platform substrate 1 has a thickness-reduced portion under the light emitting device 11, and further laminations of a silicon oxide film 22 and an electrically conductive layer 23 are provided on the lower surface of the silicon platform substrate 1. The above-described modified structure of the silicon platform substrate 1 promotes heat radiation from the light emitting device 11.

Further, in this fifth embodiment, the silicon oxide film 22 may optionally be omitted, so that the electrically conductive layer 23 may be provided directly on the bottom surface of the platform substrate 1. The platform substrate 1 of this fifth embodiment may optionally be applicable to the forgoing first, second, third and fourth embodiments.

Accordingly, the silicon oxide film 2 as a first insulating layer overlies the silicon platform substrate 1 as an electrically conductive platform substrate, so that the silicon oxide film 2 extends both the optical transmitter circuit region and the optical receiver circuit region. Further, the ground pattern 3 is selectively provided over the silicon oxide film 2 so that the ground pattern 3 extends only in the optical receiver circuit region. The insulating layer 4 as a second insulating layer is also selectively provided over the ground pattern 3, so that the insulating layer 4 extends only in the optical receiver circuit region. The light receiving device 6 the receiver LSI circuit 7 are provided over the insulating layer 4. The electrically conductive shielding cover 30 is further provided directly on the ground pattern 3 for covering the light receiving device 6 the receiver LSI circuit 7. The light emitting device 11 is provided directly on either the silicon oxide film 2 as the first insulating layer overlying the silicon platform substrate 1 or the interconnection pattern 8 over the silicon oxide film 2. The above structure provides the following effects.

First, the crosstalk between the optical transmitter circuit and the optical receiver circuit can be suppressed within −80 dB in the frequency band of not more than 14 GHz even if the electrically conductive platform substrate comprises a silicon substrate which is advantageous in low cost and high heat conductivity.

Second, the light-emitting device is provided directly on either the thin insulating film overlying the silicon platform substrate or the interconnection pattern over the thin insulating film, so that the light-emitting device is thermally coupled through the thin insulating film to the silicon platform substrate having the high heat conductivity, resulting in high heat radiation efficiency from the light-emitting device.

Third, the light-emitting device is provided directly on either the thin insulating film overlying the silicon platform substrate or the interconnection pattern over the thin insulating film, so as to keep a highly accurate level of the light-emitting device and also suppress any substantive displacement of the light-emitting device due to variation of temperature.

Fourth, the light receiving device is provided over the thick insulating film selectively provided in the optical receiver circuit region for facilitating design of coplanar transmission lines for further improvement in high frequency performance of the optical receiver circuit.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. An optical transmitter-receiver module comprising:
   an electrically conductive platform substrate having a transmitter region and a receiver region;
   a first insulating film extending over said transmitter region and said receiver region of said electrically conductive platform substrate;
   a first electrically conductive layer having a first fixed-potential, and said first electrically conductive layer extending in said receiver region and over said first insulating film;
   a second insulating film selectively extending over said first electrically conductive layer;
   an optical receiver circuit including at least a light-receiving device, and said optical receiver circuit existing over said second insulating film;
   an optical transmitter circuit including at least a light-emitting device, said optical transmitter circuit existing in said transmitter region, and said light-emitting device existing on said first insulating film; and
   a first electrically conductive shielding member spatially isolating said optical receiver circuit from said optical transmitter circuit, and said first electrically conductive shielding member being electrically coupled to said first electrically conductive layer, so that said first electrically conductive shielding member has said first fixed-potential.

2. The optical transmitter-receiver module as claimed in claim 1, wherein said light-emitting device exists directly on a first interconnection pattern on said first insulating film.

3. The optical transmitter-receiver module as claimed in claim 1, wherein said first insulating film has a smaller thickness than said second insulating film.

4. The optical transmitter-receiver module as claimed in claim 3, wherein said first insulating film comprises an oxide film, and said second insulating film comprises an electrically insulative resin film.

5. The optical transmitter-receiver module as claimed in claim 4, wherein said optical receiver circuit exists directly on a first conductive pattern extending over said second insulating film.

6. The optical transmitter-receiver module as claimed in claim 5, further comprising:
a third insulating film selectively extending in said transmitter region and over said first insulating film, except over said light-emitting device; and
a second conductive pattern extending over said third insulating film, and
wherein said optical transmitter circuit further includes at least a first integrated circuit existing directly on said second conductive pattern, and said first integrated circuit is electrically connected through a wiring to said light-emitting device.

7. The optical transmitter-receiver module as claimed in claim 6, wherein said first insulating film has a smaller thickness than said third insulating film.

8. The optical transmitter-receiver module as claimed in claim 7, wherein said third insulating film comprises an electrically insulative resin film.

9. The optical transmitter-receiver module as claimed in claim 1, wherein said electrically conductive shielding member spatially surrounds said second insulating film and said optical receiver circuit.

10. The optical transmitter-receiver module as claimed in claim 9, wherein said electrically conductive shielding member has a bottom directly on a peripheral region of said first electrically conductive layer, so that said electrically conductive shielding member is electrically coupled with said first electrically conductive layer.

11. The optical transmitter-receiver module as claimed in claim 1, further comprising a second electrically conductive layer having a second fixed potential, and said second electrically conductive layer extending in said transmitter region and over said first insulating film, and said light-emitting device exists directly on said second electrically conductive layer.

12. The optical transmitter-receiver module as claimed in claim 1, further comprising:
a third insulating film selectively extending in said transmitter region and over said second electrically conductive layer, except over said light-emitting device; and
a second conductive pattern extending over said third insulating film, and
wherein said optical transmitter circuit further includes at least a first integrated circuit existing directly on said second conductive pattern, and said first integrated circuit is electrically connected through a wiring to said light-emitting device.

13. The optical transmitter-receiver module as claimed in claim 12, wherein said first insulating film has a smaller thickness than said third insulating film.

14. The optical transmitter-receiver module as claimed in claim 13, wherein said third insulating film comprises an electrically insulative resin film.

15. The optical transmitter-receiver module as claimed in claim 1, further comprising:
an optical transmission guide having a sloped light-reflecting terminal face which is positioned under a light-receiving area on a bottom surface of said light-receiving device.

16. The optical transmitter-receiver module as claimed in claim 15, wherein said optical transmission guide comprises a groove with said sloped light-reflecting terminal face, and said groove exists in said electrically conductive platform, said first insulating film, said first electrically conductive layer, and said second insulating film.

17. The optical transmitter-receiver module as claimed in claim 1, further comprising:
a second electrically conductive shielding member which exists adjacent to a first side face of said electrically conductive platform substrate, and said second electrically conductive shielding member which faces to said light-receiving device and said light-emitting device, and said second electrically conductive shielding member having a first light transmission hole for allowing a transmission of a light to be incident into said light-receiving device, and a second light transmission hole for allowing a transmission of a light emitted from said light-emitting device.

18. The optical transmitter-receiver module as claimed in claim 17, wherein said second electrically conductive shielding member is electrically coupled to said first electrically conductive shielding member, so that said second electrically conductive shielding member also has said first fixed-potential.

19. The optical transmitter-receiver module as claimed in claim 18, wherein said second electrically conductive shielding member is mechanically in contact directly with said first electrically conductive shielding member.

20. The optical transmitter-receiver module as claimed in claim 18, wherein said second electrically conductive shielding member is mechanically connected with said first electrically conductive shielding member.

21. The optical transmitter-receiver module as claimed in claim 17, wherein said second electrically conductive shielding member has a first face which faces to said first side face of said electrically conductive platform substrate, and a second face opposite to said first face, and said second face holds an optical lens array which includes a first lens aligned to said first light transmission hole, and a second lens aligned to said second light transmission hole.

22. The optical transmitter-receiver module as claimed in claim 21, wherein said second face has a recess which engages said optical lens array.

23. The optical transmitter-receiver module as claimed in claim 22, wherein said second electrically conductive shielding member comprises a metal plate.

24. The optical transmitter-receiver module as claimed in claim 1, wherein said electrically conductive platform substrate has a bottom surface which includes a depressed region being positioned under said light-emitting device, so that said electrically conductive platform substrate has a thickness-reduced portion under said light-emitting device.

25. The optical transmitter-receiver module as claimed in claim 24, further comprising:

a first electrically conductive bottom layer on said bottom surface of said electrically conductive platform substrate.

26. The optical transmitter-receiver module as claimed in claim 24, further comprising:

a first electrically insulative bottom layer on said bottom surface of said electrically conductive platform substrate; and a first electrically conductive bottom layer on said first electrically insulative bottom layer.

27. An optical transmitter-receiver module comprising:

an electrically conductive platform substrate having a transmitter region and a receiver region;

a first insulating film extending over said transmitter region and said receiver region of said electrically conductive platform substrate;

a first electrically conductive layer having a first fixed-potential, and said first electrically conductive layer extending in said receiver region and over said first insulating film;

a second insulating film selectively extending over said first electrically conductive layer;

an optical receiver circuit including at least a light-receiving device, and said optical receiver circuit existing over said second insulating film;

an optical transmitter circuit including at least a light-emitting device, said optical transmitter circuit existing in said transmitter region, and said light-emitting device existing on said first insulating film;

a first electrically conductive shielding member spatially isolating said optical receiver circuit from said optical transmitter circuit, and said first electrically conductive shielding member being electrically coupled to said first electrically conductive layer, so that said first electrically conductive shielding member has said first fixed-potential; and a second electrically conductive shielding member which exists adjacent to a first side face of said electrically conductive platform substrate, and said second electrically conductive shielding member which faces to said light-receiving device and said light-emitting device, and said second electrically conductive shielding member having a first light transmission hole for allowing a transmission of a light to be incident into said light-receiving device, and a second light transmission hole for allowing a transmission of a light emitted from said light-emitting device.

28. The optical transmitter-receiver module as claimed in claim 27, wherein said light-emitting device exists directly on a first interconnection pattern on said first insulating film.

29. The optical transmitter-receiver module as claimed in claim 27, wherein said first insulating film has a smaller thickness than said second insulating film.

30. The optical transmitter-receiver module as claimed in claim 29, wherein said first insulating film comprises an oxide film, and said second insulating film comprises an electrically insulative resin film.

31. The optical transmitter-receiver module as claimed in claim 30, wherein said optical receiver circuit exists directly on a first conductive pattern extending over said second insulating film.

32. The optical transmitter-receiver module as claimed in claim 31, further comprising:

a third insulating film selectively extending in said transmitter region and over said first insulating film, except over said light-emitting device; and a second conductive pattern extending over said third insulating film, and wherein said optical transmitter circuit further includes at least a first integrated circuit existing directly on said second conductive pattern, and said first integrated circuit is electrically connected through a wiring to said light-emitting device.

33. The optical transmitter-receiver module as claimed in claim 32, wherein said first insulating film has a smaller thickness than said third insulating film.

34. The optical transmitter-receiver module as claimed in claim 33, wherein said third insulating film comprises an electrically insulative resin film.

35. The optical transmitter-receiver module as claimed in claim 27, wherein said electrically conductive shielding member spatially surrounds said second insulating film and said optical receiver circuit.

36. The optical transmitter-receiver module as claimed in claim 35, wherein said electrically conductive shielding member has a bottom directly on a peripheral region of said first electrically conductive layer, so that said electrically conductive shielding member is electrically coupled with said first electrically conductive layer.

37. The optical transmitter-receiver module as claimed in claim 27, further comprising a second electrically conductive layer having a second fixed potential, and said second electrically conductive layer extending in said transmitter region and over said first insulating film, and said light-emitting device exists directly on said second electrically conductive layer.

38. The optical transmitter-receiver module as claimed in claim 27, further comprising:

a third insulating film selectively extending in said transmitter region and over said second electrically conductive layer, except over said light-emitting device; and a second conductive pattern extending over said third insulating film, and wherein said optical transmitter circuit further includes at least a first integrated circuit existing directly on said second conductive pattern, and said first integrated circuit is electrically connected through a wiring to said light-emitting device.

39. The optical transmitter-receiver module as claimed in claim 38, wherein said first insulating film has a smaller thickness than said third insulating film.

40. The optical transmitter-receiver module as claimed in claim 39, wherein said third insulating film comprises an electrically insulative resin film.

41. The optical transmitter-receiver module as claimed in claim 27, further comprising:

an optical transmission guide having a sloped light-reflecting terminal face which is positioned under a light-receiving area on a bottom surface of said light-receiving device.

42. The optical transmitter-receiver module as claimed in claim 41, wherein said optical transmission guide comprises a groove with said sloped light-reflecting terminal face, and said groove exists in said electrically conductive platform, aid first insulating film, said first electrically conductive layer, and said second insulating film.

43. The optical transmitter-receiver module as claimed in claim 27, wherein said second electrically conductive shielding member is electrically coupled to said first electrically conductive shielding member, so that said second electrically conductive shielding member also has said first fixed-potential.

44. The optical transmitter-receiver module as claimed in claim 43, wherein said second electrically conductive shielding member is mechanically in contact directly with said first electrically conductive shielding member.

45. The optical transmitter-receiver module as claimed in claim 43, wherein said second electrically conductive shielding member is mechanically connected with said first electrically conductive shielding member.

46. The optical transmitter-receiver module as claimed in claim 27, wherein said second electrically conductive shielding member has a first face which faces to said first side face of said electrically conductive platform substrate, and a second face opposite to said first face, and said second face holds an optical lens array which includes a first lens aligned to said first light transmission hole, and a second lens aligned to said second light transmission hole.

47. The optical transmitter-receiver module as claimed in claim 46, wherein said second face has a recess which engages said optical lens array.

48. The optical transmitter-receiver module as claimed in claim 47, wherein said second electrically conductive shielding member comprises a metal plate.

49. The optical transmitter-receiver module as claimed in claim 27, wherein said electrically conductive platform substrate has a bottom surface which includes a depressed region being positioned under said light-emitting device, so that said electrically conductive platform substrate has a thickness-reduced portion under said light-emitting device.

50. The optical transmitter-receiver module as claimed in claim 49, further comprising:

a first electrically conductive bottom layer on said bottom surface of said electrically conductive platform substrate.

51. The optical transmitter-receiver module as claimed in claim 50, further comprising:

a first electrically insulative bottom layer on said bottom surface of said electrically conductive platform substrate; and a first electrically conductive bottom layer on said first electrically insulative bottom layer.

* * * * *